US010193600B2

(12) United States Patent
Faxér et al.

(10) Patent No.: US 10,193,600 B2
(45) Date of Patent: Jan. 29, 2019

(54) CODEBOOK SUBSET RESTRICTION SIGNALING

(71) Applicant: Telefonaktiebolaget LM Ericsson (publ), Stockholm (SE)

(72) Inventors: Sebastian Faxér, Järfälla (SE); Mattias Frenne, Uppsala (SE); Simon Järmyr, Skarpnäck (SE); George Jöngren, Sundbyberg (SE); Niklas Wernersson, Solna (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 224 days.

(21) Appl. No.: 15/105,648

(22) PCT Filed: Jan. 11, 2016

(86) PCT No.: PCT/SE2016/050009
§ 371 (c)(1),
(2) Date: Jun. 17, 2016

(87) PCT Pub. No.: WO2016/114708
PCT Pub. Date: Jul. 21, 2016

(65) Prior Publication Data
US 2018/0131420 A1 May 10, 2018

Related U.S. Application Data

(60) Provisional application No. 62/103,101, filed on Jan. 14, 2015.

(51) Int. Cl.
*H04B 7/04* (2017.01)
*H03M 7/30* (2006.01)
(Continued)

(52) U.S. Cl.
CPC ........ *H04B 7/0469* (2013.01); *H03M 7/3068* (2013.01); *H04B 7/0456* (2013.01);
(Continued)

(58) Field of Classification Search
CPC .. H04B 7/0469; H04B 7/0478; H04B 7/0639; H03M 7/3068; H03M 7/3082
See application file for complete search history.

(56) References Cited

U.S. PATENT DOCUMENTS

2010/0223237 A1 9/2010 Mishra et al.
2011/0170638 A1 7/2011 Yuan et al.
(Continued)

FOREIGN PATENT DOCUMENTS

RU 2011140068 A 4/2013

OTHER PUBLICATIONS

Alameldeen, A., et al., "Frequent Pattern Compression: A Significance-Based Compression Scheme for L2 Caches", Technical Report #1500, May 1, 2004, pp. 1-15, University of Wisconsin.
(Continued)

*Primary Examiner* — Brian D Nguyen
(74) *Attorney, Agent, or Firm* — Coats & Bennett, PLLC

(57) ABSTRACT

A network node (10) signals to a wireless communication device (14) which precoders in a codebook are restricted from being used. The network node (10) in this regard generates codebook subset restriction signaling that, for each of one or more groups of precoders, jointly restricts the precoders in the group by restricting a certain component (e.g., a certain beam precoder) that the precoders in the group have in common. This signaling may be for instance rank-agnostic signaling that jointly restricts the precoders in a group without regard to the precoders' transmission rank. Regardless, the network node (10) sends the generated signaling to the wireless communication device (14).

28 Claims, 14 Drawing Sheets

(51) Int. Cl.
*H04B 7/0456* (2017.01)
*H04B 7/06* (2006.01)

(52) U.S. Cl.
CPC ......... *H04B 7/0478* (2013.01); *H04B 7/0658* (2013.01); *H03M 7/3082* (2013.01); *H04B 7/0639* (2013.01)

(56) References Cited

U.S. PATENT DOCUMENTS

| | | |
|---|---|---|
| 2011/0243098 A1 | 10/2011 | Koivisto et al. |
| 2011/0249713 A1 | 10/2011 | Hammarwall et al. |
| 2012/0020434 A1 | 1/2012 | Callard et al. |
| 2013/0163687 A1* | 6/2013 | Jing .................... H04B 7/0658 375/267 |
| 2013/0229980 A1 | 9/2013 | Wernersson et al. |
| 2014/0016549 A1* | 1/2014 | Novlan ................ H04B 7/0417 370/328 |
| 2014/0198751 A1* | 7/2014 | Prasad ................ H04B 7/0452 370/329 |
| 2014/0198868 A1* | 7/2014 | Yang ................... H04B 7/0478 375/267 |
| 2014/0205031 A1* | 7/2014 | Nammi ............... H04B 7/0413 375/267 |
| 2014/0254508 A1* | 9/2014 | Krishnamurthy .... H04B 7/0417 370/329 |
| 2014/0269577 A1* | 9/2014 | Hammarwall ....... H04B 7/0634 370/329 |
| 2016/0233939 A9* | 8/2016 | Hammarwall ....... H04B 7/0634 |

OTHER PUBLICATIONS

Thomas, M. et al., "Elements of Information Theory", Chapter 3, Asymptotic Equipartition Property', Jan. 1, 2006, pp. 57-62, Second edition, John Wiley & Sons, Inc.

Ericsson, "Remaining Details of Codebook Subset Restriction", 3GPP TSG-RAN WG1#83, Anaheim, USA, Nov. 15, 2015, pp. 1-6, R1-157203, 3GPP.

AT&T, "WF on class A and class B CSI reporting for Rel.13 EB FD-MIMO", 3GPP TSG RAN WG1 Meeting #82bis, Malmö, Sweden, Oct. 5, 2015, pp. 1-10, R1-156165, 3GPP.

* cited by examiner $$\varphi_n = e^{jn\pi/2}$$
$$v_m = \begin{bmatrix} 1 & e^{j2\pi m/32} & e^{j4\pi m/32} & e^{j6\pi m/32} \end{bmatrix}^T$$

Codebook for 2-layer CSI reporting using antenna ports 15 to 22

| $i_1$ | | | $i_2$ | | |
|---|---|---|---|---|---|
| | 0 | 1 | 2 | 3 | |
| 0 – 15 | $W^{(2)}_{2i_1,2i_1,0}$ | $W^{(2)}_{2i_1,2i_1,1}$ | $W^{(2)}_{2i_1+1,2i_1+1,0}$ | $W^{(2)}_{2i_1+1,2i_1+1,1}$ | |
| $i_1$ | | | $i_2$ | | |
| | 4 | 5 | 6 | 7 | |
| 0 – 15 | $W^{(2)}_{2i_1+2,2i_1+2,0}$ | $W^{(2)}_{2i_1+2,2i_1+2,1}$ | $W^{(2)}_{2i_1+3,2i_1+3,0}$ | $W^{(2)}_{2i_1+3,2i_1+3,1}$ | |
| $i_1$ | | | $i_2$ | | |
| | 8 | 9 | 10 | 11 | |
| 0 – 15 | $W^{(2)}_{2i_1,2i_1+1,0}$ | $W^{(2)}_{2i_1,2i_1+1,1}$ | $W^{(2)}_{2i_1+1,2i_1+2,0}$ | $W^{(2)}_{2i_1+1,2i_1+2,1}$ | |
| $i_1$ | | | $i_2$ | | |
| | 12 | 13 | 14 | 15 | |
| 0 – 15 | $W^{(2)}_{2i_1,2i_1+3,0}$ | $W^{(2)}_{2i_1,2i_1+3,1}$ | $W^{(2)}_{2i_1+1,2i_1+3,0}$ | $W^{(2)}_{2i_1+1,2i_1+3,1}$ | | where $W^{(2)}_{m,m',n} = \dfrac{1}{4}\begin{bmatrix} v_m & v_{m'} \\ \varphi_n v_m & -\varphi_n v_{m'} \end{bmatrix}$

Figure 6

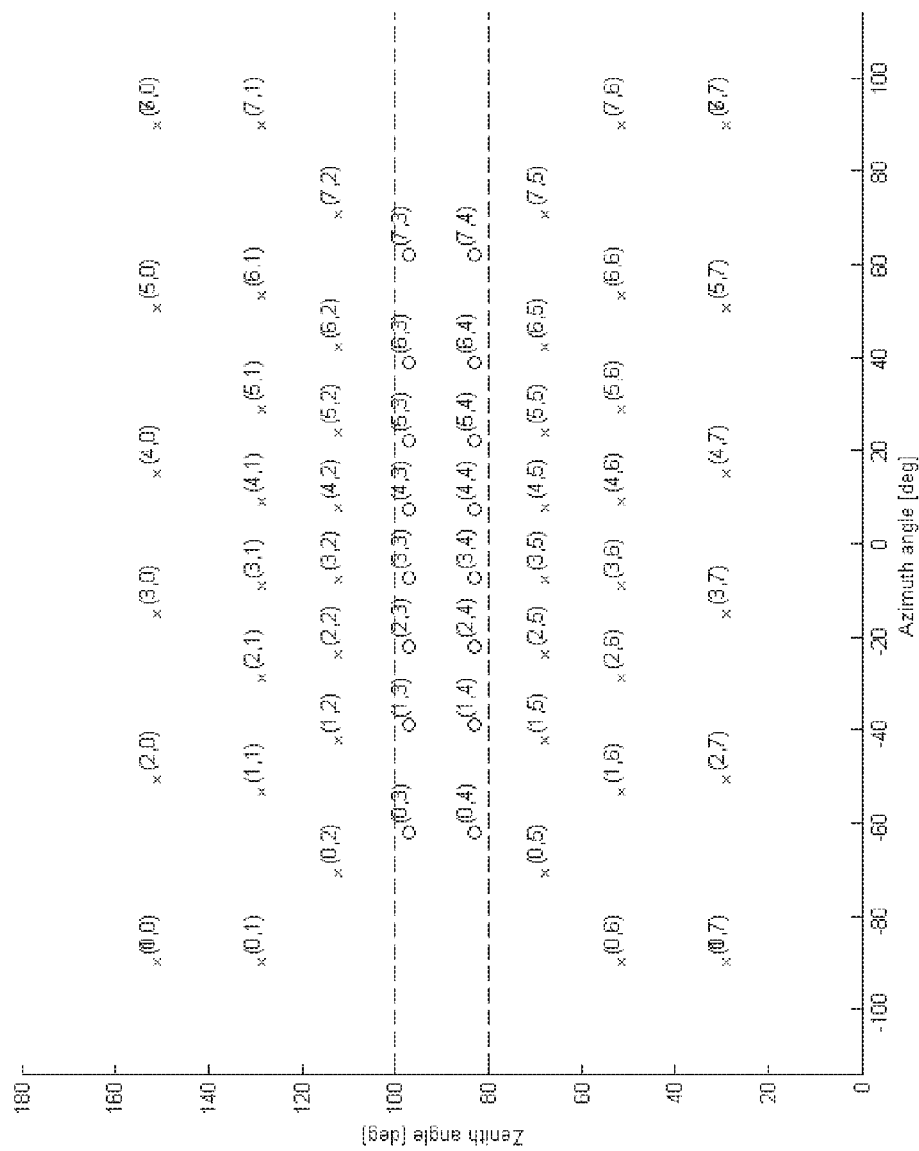

US 10,193,600 B2

CODEBOOK SUBSET RESTRICTION SIGNALING

RELATED APPLICATIONS

This application claims priority to U.S. Provisional patent Application Ser. No. 62/103,101 filed Jan. 14, 2015, the entire contents of which are incorporated herein by reference.

TECHNICAL FIELD

The present application relates generally to a network node and a wireless communication device for operation in a wireless communication system, and more particularly to the network node signaling to the wireless communication device which precoders in a codebook are restricted from being used.

BACKGROUND

The use of multiple antennas at the transmitter and/or the receiver of a wireless communication system can significantly boost the capacity and coverage of a wireless communication system. Such MIMO systems can exploit the spatial dimension of the communication channel. For example, several information-carrying signals can be sent in parallel using the transmit antennas and still be separated by signal processing at the receiver. By adapting the transmission to the current channel conditions, significant additional gains can be achieved. One form of adaptation is to dynamically, from one TTI to another, adjust the number of simultaneously transmitted information streams carrying signals to what the channel can support. This is commonly referred to as (transmission) rank adaptation. Precoding is another form of adaptation where the phases and amplitudes of the aforementioned signals are adjusted to better fit the current channel properties. The signals form a vector-valued signal and the adjustment can be thought of as multiplication by a precoder matrix. A common approach is to select the precoder matrix from a finite and indexed set, a so-called codebook. Such codebook-based precoding is an integral part of the LTE standard, as well as in many other wireless communication standards.

Codebook based precoding can be regarded as a form of channel quantization. A typical approach (c.f. LTE and MIMO HSDPA) is to let the receiver recommend a suitable precoder matrix to the transmitter by signaling the precoder matrix indicator (PMI) over a feedback link. To limit signaling overhead, it is generally important to keep the codebook size as small as possible if the feedback link has a limited capacity. This however needs to be balanced against the performance impact since with a larger codebook it is possible to better match the current channel conditions.

For example, in the LTE downlink, the user equipment (UE) reports the precoding matrix indicator (PMI) to the eNodeB either periodically on the physical uplink control channel (PUCCH) or aperiodic on the physical uplink shared channel (PUSCH). The former is a rather narrow bit pipe (e.g., using a few bits) where channel state information (CSI) feedback is reported in a semi-statically configured and periodic fashion. CSI feedback in this regard includes one or more channel quality indicators (CQIs), PMIs, and/or a transmission rank (e.g., indicating a number of transmission layers). On the other hand, reporting on PUSCH is dynamically triggered as part of the uplink grant. Thus, the eNodeB can schedule CSI transmissions in a dynamic fashion. In contrast to the PUCCH where the number of physical bits is currently limited to 20, the reports on PUSCH can be considerably larger. Thus, for feedback on PUCCH a small codebook size is desirable to keep the signaling overhead down. However, for feedback on PUSCH a larger codebook size is desirable to increase performance, since the capacity on the feedback channel is not as limited in this case.

The desired size of the codebook may also depend on the transmission scheme used. For example, a codebook used in multi-user multiple input multiple output (MU-MIMO) operation could benefit more from having a larger number of elements than a codebook used in single-user multiple input multiple output (SU-MIMO) operation. In the former case, a large spatial resolution is important to allow for sufficient UE separation.

A convenient way to support different codebook sizes is to use a large codebook with many elements by default and apply codebook subset restriction in the scenarios where a smaller codebook is beneficial. With codebook subset restriction, a subset of the precoders in the codebook is restricted so that the UE has a smaller set of possible precoders to choose from. This effectively reduces the size of the codebook implying that the search for the best PMI can be done on the smaller unrestricted set of precoders, thereby also reducing the UE computational requirements for this particular search.

Typically, the eNodeB would signal the codebook subset restriction to the UE by means of a bitmap in an a dedicated message part of the AntennaInfo information element (see the RRC specification, TS 36.331), one bit for each precoder in the codebook, where a 1 would indicate that the precoder is restricted (meaning that the UE is not allowed to choose and report said precoder). Thus, for a codebook with N elements, a bitmap of length N would be used to signal the codebook subset restriction. This allows for full flexibility for the eNodeB to restrict every possible subset of the codebook. There are thus $2^N$ possible codebook subset restriction configurations.

For large antenna arrays with many antenna elements, the effective beams become narrow and a codebook containing many precoders is required for the intended coverage area. Furthermore, for two-dimensional antenna arrays, the codebook size increases quadratically since the precoders in the codebook need to span two dimensions, typically the horizontal and vertical domain. Thus, the codebook size (i.e. the total number of possible precoding matrices W) can be very large. Signaling a codebook subset restriction in the conventional way by means of a bitmap with one bit for every precoder can thus impose a large overhead, especially if the codebook subset restriction (CSR) is frequently updated or if there are many users served by the cell which each has to receive the CSR.

SUMMARY

One or more embodiments herein include a method implemented by a network node for signaling to a wireless communication device which precoders in a codebook are restricted from being used. The method comprises generating codebook subset restriction signaling that, for each of one or more groups of precoders, jointly restricts the precoders in the group by restricting a certain component that the precoders in the group have in common. The method further comprises sending the generated signaling from the network node to the wireless communication device.

Embodiments herein also correspondingly include a method implemented by a wireless communication device for decoding signaling from a network node indicating which precoders in a codebook are restricted from being used. The method comprises receiving codebook subset restriction signaling that, for each of one or more groups of precoders, jointly restricts the precoders in the group by restricting a certain component that the precoders in the group have in common. The method further comprises decoding the received signaling as jointly restricting precoders in each of the one or more groups of precoders.

In some embodiments, the codebook subset restriction signaling is rank-agnostic signaling that jointly restricts the precoders in a group without regard to the precoders' transmission rank.

In some embodiments, the certain component comprises a beam precoder. In some embodiments, for example, a beam precoder is a Kronecker product of different beamforming vectors associated with different dimensions of a multi-dimensional antenna array. In this case, the different beamforming vectors may comprise Discrete Fourier Transform (DFT) vectors.

In other embodiments where the certain component comprises a beam precoder, a beam precoder is a beamforming vector used to transmit on a particular layer of a multi-layer transmission. Different scaled versions of that beamforming vector are transmitted on different polarizations.

In still other such embodiments, a beam precoder is a beamforming vector used to transmit on: multiple different layers of a multi-layer transmission; multiple different layers of a multi-layer transmission, wherein the layers are sent on orthogonal polarizations; or a particular layer and on a particular polarization.

In some embodiments, a precoder comprising one or more beam precoders is restricted if at least one of its one or more beam precoders is restricted.

In any of these embodiments, the codebook subset restriction signaling may comprise a bitmap, with different bits in the bitmap respectively dedicated to indicating whether or not different beam precoders are restricted from being used.

Alternatively or additionally, a beam precoder may be a Kronecker product of first and second beamforming vectors with first and second indices. In this case, the first and second beamforming vectors may be associated with different dimensions of a multi-dimensional antenna array, and the codebook subset restriction signaling may jointly restrict the precoders in a group of precoders that have the same pair of values for the first and second indices.

In some embodiments, each precoder comprises one or more beam precoders. In some of these embodiments, each beam precoder comprises multiple different components corresponding to different dimensions of a multi-dimensional antenna array. The certain component in this case may comprise a component of a beam precoder.

In some embodiments, the codebook subset restriction signaling jointly restricts the precoders in a group of precoders that transmit at least in part towards a certain angular pointing direction, by restricting a certain component which has that angular pointing direction.

Embodiments herein also include another method implemented by a network node for signaling to a wireless communication device which precoders in a codebook are restricted from being used. The method comprises a number of steps for each of one or more groups of precoders in the codebook. These steps include identifying one or more reference configurations for the group. Each reference configuration is one of different possible configurations that restrict different subgroups of precoders in the group from being used. The steps also include identifying, from the different possible configurations for the group, an actual configuration to be signaled for the group. The steps also include generating signaling to indicate the actual configuration for the group, by generating the signaling as a bit pattern whose length depends on (i) whether the actual configuration matches one of the one or more reference configurations and/or (ii) which reference configuration the actual configuration matches. The method further comprises sending the generated signaling to the wireless communication device.

Embodiments herein further include another corresponding method implemented by a wireless communication device for decoding signaling from a network node indicating which precoders in a codebook are restricted from being used. The method includes receiving signaling from the network node. The method also entails a number of steps for each of one or more groups of precoders in the codebook. These steps include identifying one or more reference configurations for the group. Each reference configuration is one of different possible configurations that restrict different subgroups of precoders in the group from being used. The steps further include identifying a bit pattern defined for signaling each reference configuration, and a length of that bit pattern. The steps also include detecting an actual configuration signaled for the group, by detecting in the signaling a bit pattern whose length depends on (i) whether the actual configuration matches one of the one or more reference configurations and/or (ii) which reference configuration the actual configuration matches.

In some embodiments, the signaling is a short bit pattern when the actual configuration matches any one of the one or more reference configurations and is a long bit pattern when the actual configuration does not match any of the one or more reference configurations. A long bit pattern has more bits than a short bit pattern. In this case, the one or more reference configurations for at least one of the one or more groups may comprise a single reference configuration, and different long bit patterns may be respectively defined for signaling different configurations other than the single reference configuration. Alternatively or additionally, a long bit pattern defined for signaling the actual configuration for the group may comprise: (i) a non-reference bit pattern defined for signaling that the actual configuration does not match a reference configuration for the group; and (ii) a bitmap comprising different bits respectively dedicated to indicating whether different precoders in the group are restricted from being used.

In some embodiments, the one or more reference configurations for at least one of the one or more groups comprise multiple reference configurations. In this case, when the actual configuration matches a particular one of the multiple reference configurations, the signaling is a bit pattern whose length is shorter than that of a bit pattern generated when the actual configuration matches a different one of the multiple reference configurations.

In some embodiments, the one or more reference configurations for a group each have an actual or assumed higher probability of being signaled than any other possible configuration that is not one of the one or more reference configurations.

In some embodiments, the method is performed for multiple different groups that respectively include different portions of the precoders in the codebook. In this case, the signaling indicates the actual configurations for the groups in a defined order. The one or more reference configurations for each group comprises a single reference configuration, and the single reference configuration for any given group is the actual configuration, if any, signaled immediately before that of the given group.

In some embodiments, the codebook is a Kronecker codebook defined for a multi-dimensional antenna array and comprises different precoders indexed by different possible values of a single index parameter. In this case, the different possible values of the single index parameter are divided into different clusters of consecutively ordered values, and precoders in different ones of the one or more groups are respectively indexed by the different clusters of consecutively ordered values.

In some embodiments, the codebook is a Kronecker codebook defined for a multi-dimensional antenna array and comprises different precoders indexed by different pairs of possible values for a first-dimension index parameter and a second-dimension index parameter. In this case, precoders in each of the one or more groups are indexed by pairs that have the same value for either the first-dimension index parameter or the second-dimension index parameter.

Embodiments herein further include corresponding apparatus and computer program products.

In at least some embodiments, signaling a codebook subset restriction in this way advantageously lowers the signaling overhead imposed by transmitting the codebook subset restriction, while still allowing for flexibility in configuring different codebook subset restrictions.

Embodiments herein therefore generally include methods to reduce the number of bits required for signaling a codebook subset restriction configuration to a wireless communication device. The methods in one or more of these embodiments do so by:

Utilizing an explicit or implicit assumption about which sets of precoders are more likely to be restricted, and/or associating a group of precoders with a single codebook subset restriction bit.

BRIEF DESCRIPTION OF THE DRAWINGS

FIG. 6 is a block diagram of an exemplary codebook according to some embodiments.

FIG. 7 is a graph illustrating the angular pointing directions of precoders in a codebook according to other embodiments.

DETAILED DESCRIPTION

Figure 1:
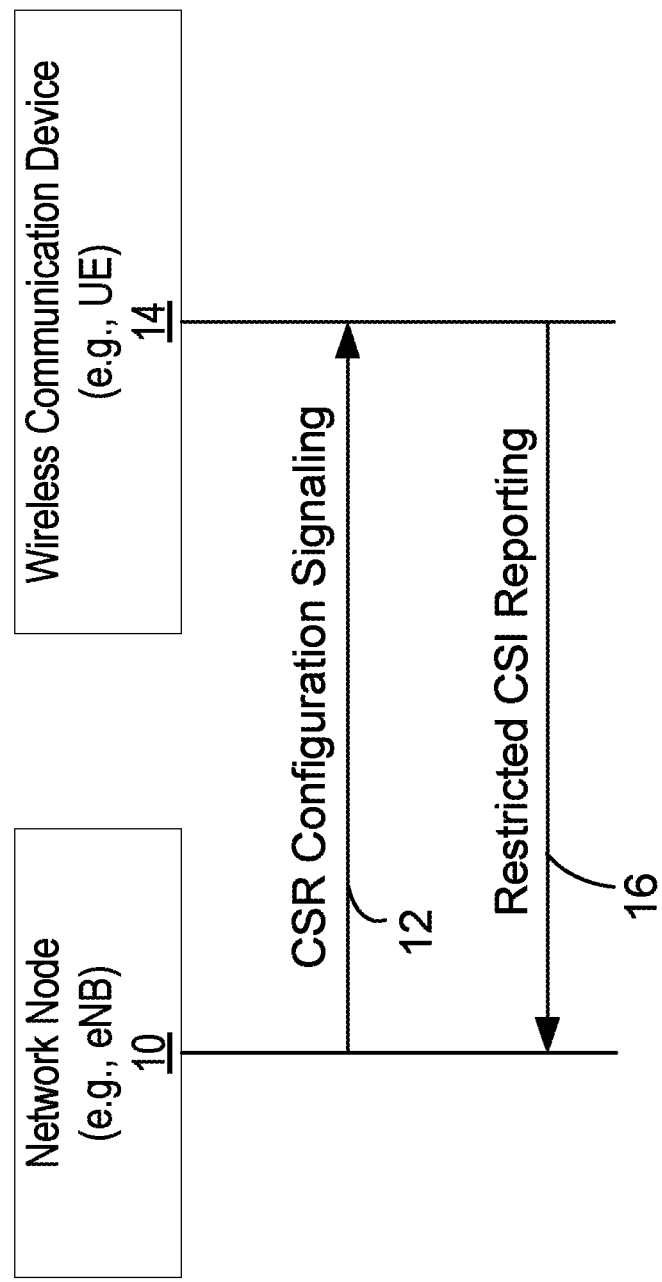
FIG. 1 is a logic flow diagram indicating codebook subset restriction (CSR) signaling between a network node and a wireless communication device according to one or more embodiments.

According to the flowchart of FIG. 1, a network node 10 in a wireless communication network (e.g., an eNB in the network) signals a codebook subset restriction (CSR) configuration 12 to a wireless communication device 14 (e.g., a UE). The device 14 then sends a channel state information (CSI) report 16 back to the network. This CSI report 16 suggests which of different possible precoders in a codebook the network should use for transmitting to the device 14, but the CSI report 16 is restricted in the sense that there is a subset of precoders that cannot be reported by the device 14; that is, all precoders in the codebook cannot be selected and reported by the device 14. This restriction is defined by the signaled CSR configuration 12.

In more detail, for a precoder codebook X, consisting of N precoders, there are $2^N$ possible codebook subset restriction configurations since each precoder can individually either be allowed or restricted (a restricted configuration is not allowed to be used). Each configuration can be represented by a bitmap of N bits, where each bit corresponds to a certain precoder and the value of the bit then indicates whether the precoder is restricted or not. If each of the $2^N$ configurations is equiprobable and independent, this is the optimal representation of a codebook subset restriction configuration with respect to the expected length (in bits) of the representation and it provides full flexibility.

However, embodiments herein recognize that, if certain configurations are more likely to be used than others, and/or if the restriction of one precoder is highly correlated to the restriction of another precoder, then this signaling leads to unnecessarily high signaling overhead. One or more embodiments herein include methods to reduce this signaling overhead; that is, reduce the number of bits required for signaling a codebook subset restriction configuration to a wireless communication device 14 from the network. In some embodiments, for example, the methods utilize an implicit assumption about which sets of precoders are more likely to be restricted or which sets of precoders are likely to be jointly restricted.

Figure 2:
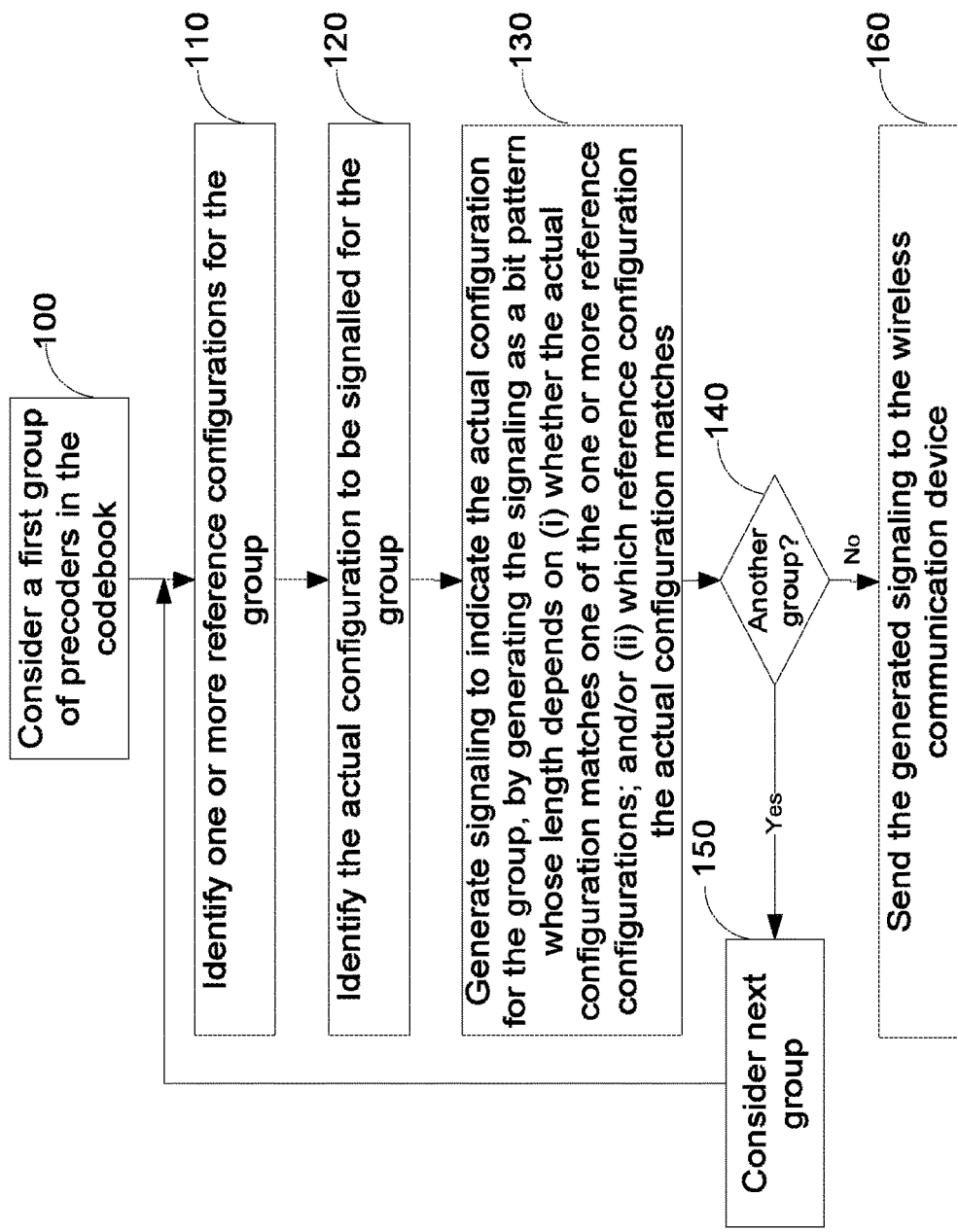
FIG. 2 is a logic flow diagram of a method implemented by a network node for signaling to a wireless communication device which precoders in a codebook are restricted from being used, according to some embodiments.

According to one embodiment shown in FIG. 2, for example, a method is implemented by a network node 10 (e.g., a base station) for signaling to a wireless communication device 14 which precoders in a codebook are restricted from being used. For each of one or more groups of precoders in the codebook, the method includes identifying one or more reference configurations for the group (Block 110). Each reference configuration is one of different possible configurations that restrict different subgroups of precoders in the group from being used. One of the reference configurations for a group may be for instance whichever one of the different possible configurations has the maximum probability of being signaled, e.g., as predicted or estimated based on empirical observations or implicit assumptions. Regardless, the method further includes identifying, from the different possible configurations for the group, the actual configuration to be signaled for the group (Block 120).

The method also includes generating signaling to indicate the actual configuration for the group (Block 130). This entails generating the signaling as a bit pattern whose length depends on (i) whether the actual configuration matches one of the one or more reference configurations; and/or (ii) which reference configuration the actual configuration matches. In some embodiments, for example, when the actual configuration matches any reference configuration, the bit pattern's length is shorter than when the actual configuration does not match any reference configuration. In other embodiments, when the actual configuration matches a particular one of multiple reference configurations, the bit pattern's length is shorter than when the actual configuration matches a different one of the reference configurations. Regardless, this process (Blocks 110-130) is repeated for each of one or more groups of precoders in the codebook (Blocks 100, 140, and 150). Finally, the method includes sending the generated signaling to the wireless communication device 14 (Block 160).

This approach may in some sense be viewed as a sort of compression algorithm for CSR signaling. Indeed, the approach advantageously reduces the signaling overhead when, over the course of a given time period, the overhead savings realized by signaling bit patterns with relatively shorter lengths outweighs the overhead costs imposed by signaling bit patterns with relatively longer lengths. Depending on the relative lengths of the bit patterns, then, the approach may for instance reduce signaling overhead when the one or more reference configurations (or particular ones of the one or more reference configurations) are signaled more often than not.

In at least some embodiments, therefore, a reference configuration has a higher likelihood or probability of being signaled than any other possible configurations that are not reference configurations. For example, the one or more reference configurations for a group may include whichever one(s) of the different possible configurations for the group have the highest probability of being signaled. Different reference configurations that have different probabilities of being signaled may be represented with bit patterns of different lengths, where reference configurations with higher probabilities are represented with bit patterns of shorter lengths. That is, certain configurations that are deemed more probable may be represented with a fewer number of bits, while other configurations, that are deemed less probable to be used, may be represented with a larger number of bits.

In some embodiments, the one or more reference configurations may be predefined to be particular one(s) of the possible configurations, e.g., based on an (implicit) assumption that the particular configuration(s) have the highest probability of being signaled. For example, an implicit assumption is made on how the network is likely to be configured. Hence, here certain configurations are considered more likely than others but there are no actual probability values estimated for the different configurations.

In other embodiments, though, the network node 10 determines signaling probabilities of different configurations, e.g., based on empirical observations and compares those probabilities to identify the configuration(s) with the highest probability. In one embodiment for example signaling probabilities are estimated through logging of network data. Hence, here it may be possible to estimate actual probabilities for the different configurations. In general, therefore, the knowledge on "how likely" a certain configuration is may be obtained in many ways.

In some embodiments, only a single reference configuration is defined for a group. In this case, the signaling is generated as a short bit pattern when the actual configuration matches the reference configuration and as a long bit pattern when the actual configuration does not match the reference configuration. Different long bit patterns in this regard are respectively defined for signaling different configurations (other than the reference configuration, for which the short bit pattern is defined for signaling). A long bit pattern of course has more bits than a short bit pattern (e.g., N bits vs. 1 bit).

In other embodiments, multiple reference configurations are defined for a group. In this case, the signaling may be generated as bit patterns that have different lengths when the actual configuration matches different reference configurations. These lengths may correspond to how likely it is that the reference configurations will be signaled. The bit pattern's length may be shortest when the actual configuration matches a particular one of the reference configurations (e.g., the one with the maximum probability of being signaled), may be next shortest when the actual configuration matches a different reference configuration (e.g., the one with the next highest signaling probability), and may be longest when the actual configuration does not match any of the reference configurations.

In some embodiments, bit patterns signaling non-reference configurations are encoded as a combination of a so-called "non-reference bit pattern" and a "bitmap." The non-reference bit pattern is defined for signaling that the actual configuration for the group does not match any reference configuration for the group. The non-reference bit pattern may for instance be the complement of a bit pattern defined for signaling a reference configuration. For example, when only a single reference configuration is defined for a group, the bit pattern signaling that reference configuration may simply be a single bit with a value of "1", whereas the non-reference bit pattern may be a single bit with a value of "0". Regardless, the bitmap portion of the bit pattern comprises different bits respectively dedicated to indicating whether different precoders in the group are restricted from being used.

In at least some embodiments, the method is performed for only one group. This single group in one embodiment includes all precoders in the codebook.

In another embodiment, of course, the single group includes only a portion of the precoders in the codebook, such that the signaling approach is adopted for only this portion, while other signaling approaches (e.g., the conventional bitmap) is adopted for other portions.

In other embodiments, the method is performed for multiple different groups that respectively include different portions of the precoders in the codebook. In one such embodiment, the signaling indicates the actual configurations for the groups in a defined order. In one embodiment, the one or more reference configurations for any given group includes the actual configuration, if any, signaled immediately before that of the given group (according to the defined order).

Consider an example with an arbitrary codebook of size N, where the single group includes all N precoders. A certain configuration out of the $2^N$ possible codebook subset restriction configurations for the single group is deemed more probable. This configuration is represented by a single bit, '1'. The other $2^N-1$ configurations are represented by a '0', followed by a bitmap of size N. One of the configurations is then represented by 1 bit, while the other configurations are represented by N+1 bits. Since the configuration represented by one bit is more frequently signaled, according to the assumption, the average number of bits required to convey the codebook subset restriction may be much less than N.

However, if the assumption that one of the possible codebook subset restriction configurations was more likely than the others was incorrect for the actual usage of codebook subset restriction configurations, the average number of bits required to convey a codebook subset restriction to a UE may be larger than N bits. One or more embodiments herein therefore aim to choose the representations of the $2^N$ configurations well. Various methods may represent the $2^N$ configurations differently depending on which sets of precoders are more likely to be restricted.

Consider for example embodiments where the codebook is defined for a multi-dimensional (e.g., two-dimensional) antenna array. Such antenna arrays may be (partly) described by the number of antenna columns corresponding to the horizontal dimension $M_h$, the number of antenna rows corresponding to the vertical dimension $M_v$ and the number of dimensions corresponding to different polarizations $M_p$. The total number of antennas is thus $M=M_h M_v M_p$. It should be pointed out that the concept of an antenna is non-limiting in the sense that it can refer to any virtualization (e.g., linear mapping) of the physical antenna elements. For example, pairs of physical sub-elements could be fed the same signal, and hence share the same virtualized antenna port.

Figure 3:
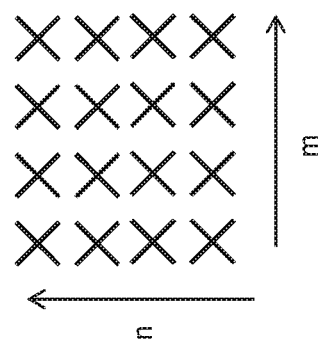
FIG. 3 is a block diagram of a two-dimensional antenna array of cross-polarized antenna elements according to some embodiments.

An example of a 4×4 array with cross-polarized antenna elements is illustrated in FIG. 3. Specifically, FIG. 3 shows a two-dimensional antenna array of cross-polarized antenna elements ($M_p=2$), with $M_h=4$ horizontal antenna elements and $M_v=4$ vertical antenna elements, assuming one antenna element corresponds to one antenna port.

Precoding may be interpreted as multiplying the signal with different beamforming weights for each antenna prior to transmission. A typical approach is to tailor the precoder to the antenna form factor, i.e. taking into account $M_h$, $M_v$ and $M_p$ when designing the precoder codebook.

According to some embodiments, a precoder codebook is tailored for 2D antenna arrays by combining precoders tailored for a horizontal array and a vertical array respectively by means of a Kronecker product. This means that (at least part of) the precoder can be described as a function of $$W_H \otimes W_V$$

where $W_H$ is a horizontal precoder taken from a (sub)-codebook $X_H$ containing $N_H$ codewords and similarly $W_V$ is a vertical precoder taken from a (sub)-codebook $X_V$ containing $N_V$ codewords. The joint codebook, denoted $X_H \otimes X_V$, thus contains $N_H \cdot N_V$ codewords. The elements of $X_H$ are indexed with $k=0, \ldots, N_H-1$, the elements of $X_V$ are indexed with $l=0, \ldots, N_V-1$ and the elements of the joint codebook $X_H \otimes X_V$ are indexed with $m=N_V \cdot k+l$ meaning that $m=0, \ldots, N_H \cdot N_V-1$.

In some embodiments, for example, the (sub)-codebooks of the Kronecker codebook consist of DFT-precoders. In this case, the horizontal codebook can be expressed as $X_H^k =$ $$\left[1 \; e^{j2\pi \frac{1k+\Delta_h}{M_h Q_h}} \; \ldots \; e^{j2\pi \frac{(M_h-1)k+\Delta_h}{M_h Q_h}}\right]^T, k = 0, \ldots, M_h Q_h - 1,$$

where $Q_h$ is an integer horizontal oversampling factor and $\Delta_h$ can take on value in the interval 0 to 1 so as to "shift" the beam pattern ($\Delta_h=0.5$ could be an interesting value for creating symmetry of beams with respect to the broadside of an array). And the vertical codebook can be expressed as $$X_V^l = \left[1 \; e^{j2\pi \frac{1l+\Delta_v}{M_v Q_v}} \; \ldots \; e^{j2\pi \frac{(M_v-1)l+\Delta_v}{M_v Q_v}}\right]^T, l = 0, \ldots, M_v Q_v - 1,$$

where $Q_v$ is an integer vertical oversampling factor and $\Delta_v$ is similarly defined as above.

It should be pointed out that a precoder codebook may be defined in several ways. For example, the above mentioned Kronecker codebook may be interpreted as one codebook indexed with a single PMI m. Alternatively, it may be interpreted as a single codebook indexed with two PMIS k and l. It may also be interpreted as two separate codebooks, indexed with k and l respectively. Further, the Kronecker codebook discussed above may only describe a part of the precoder, i.e. the precoder may be a function of other parameters as well. In a such example, the precoder is a function also of another PMI n. Again, this can be interpreted as three separate codebooks with indices k, l and n respectively, or two separate codebooks with indices m=$N_V \cdot k+l$ and n respectively. It may also be interpreted as a single joint codebook with a joint PMI. Embodiments herein should be considered agnostic with respect to how a codebook is defined.

With this understanding, the codebook at issue in FIG. 2 may be a Kronecker codebook that comprises different precoders indexed (at least in part) by different possible values of a single index parameter (e.g., index parameter m=0, ..., $N_H \cdot N_V-1$). In this case, the different possible values of the single index parameter are divided into different clusters of consecutively ordered values. And precoders in the different groups are respectively indexed (at least in part) by the different clusters of consecutively ordered values. For example, precoders indexed by the cluster m=0, ... m1 belong to a first group, precoders indexed by the cluster m=m2, ... m3 belong to a second group, precoders indexed by the cluster m=m4, ... m5 belong to a third group, and so on. As an even more specific example, one or more embodiments exploit the Kronecker structure of the precoder by mapping the index m to indices k and l as m=$N_v k+l$ and grouping the precoders such that m=0, ..., Nv-1 is the first group, m=Nv, ..., 2Nv-1 is the second group, etc.

In another embodiment, by contrast, the Kronecker codebook comprises different precoders indexed (at least in part) by different pairs of possible values for a first-dimension index parameter (e.g., k=0, ..., $N_H-1$) and a second-dimension index parameter (e.g., l=0, ..., $N_V-1$). In this case, precoders in each of the different groups are indexed (at least in part) by pairs (k,l) that have the same value for the first-dimension index parameter k and/or the second-dimension index parameter l.

Two different embodiments in this regard, referred to as a "similar rows embodiment" and a "similar columns embodiment", will now be illustrated in the context of a Kronecker codebook and where only a single reference configuration is defined for a group. The Kronecker codebook in this example consists of precoders with different angular directions, spanning a two-dimensional angular area as seen from the transmitter. An important use case for codebook subset restriction in such an embodiment may be to restrict precoders in a certain angular area or angle interval, e.g.

corresponding to a direction where a user hotspot of an adjacent cell is located. The eNodeB would then reduce interference to said adjacent cell and particular the hotspot area if precoders corresponding to beams pointing at that direction were restricted. This is beneficial from a system capacity perspective.

Figure 4:
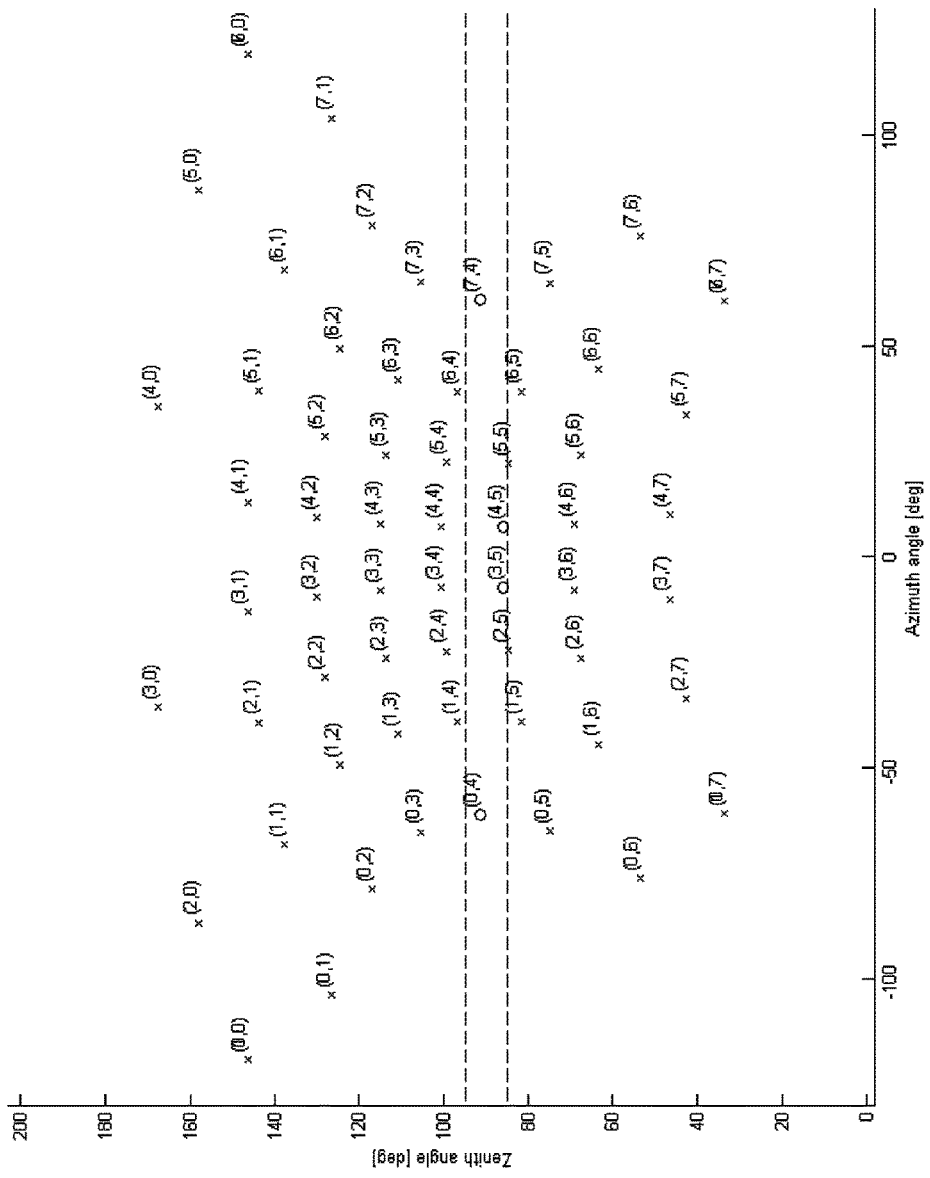
FIG. 4 is a graph illustrating the angular pointing directions of precoders in a codebook according to some embodiments.

In the following, consider the specific example where codebook subset restriction is used on a Kronecker codebook in order to understand how different embodiments can be used to reduce the signaling overhead. In this scenario, a 4×4 antenna array with a mechanical downtilt of 18° is used. The Kronecker codebook consists of 8 vertical and 8 horizontal precoders, i.e. $N_H=N_V=8$. The angular pointing directions of the precoders in the codebook are illustrated in FIG. 4.

Codebook subset restriction is applied to restrict beams with pointing directions in the zenith interval [85°,95°] (illustrated with dotted lines). That is, codebook subset restriction is applied in the angular interval 85°<θ<95°, meaning that the precoders with indices (k,l)=(0,4), (3,5), (4,5), (7,4) are restricted. These restricted beams are illustrated with an 'o' while the unrestricted beams are illustrated with an 'x'. The beam index k in the horizontal codebook and l in the vertical codebook is written next to the beams as (k,l). If this configuration of codebook subset restriction would be signaled with a conventional bitmap, $N=N_H \cdot N_V=64$ bits would be used.

Similar Rows Embodiment

In one embodiment, by using compressing of the CSR signaling, a scheme is designed taking into consideration the hypothesis that precoders (k,l) with adjacent l-indices (i.e. $(k,l_0-1)$, $(k,l_0)$ and $(k,l_0+1)$) are likely to have the same restriction setting, meaning that if $(k,l_0)$ is restricted, $(k,l_0+1)$ is likely to be restricted as well and vice versa. The scheme works as follows:

First, a bitmap of $N_H$ bits are sent, indicating the codebook subset restriction for the "row" of precoders where l=0 (c.f. FIG. 4), i.e the precoders (k,l)=(0,0), (1,0), . . . , $(N_H-1,0)$.

Then, the codebook subset restriction for the second "row" of precoders, where l=1 is sent. If the restriction is the same as for the previous row of precoders, a '1' is sent. If the restriction for this row differs from the restriction of the previous row, a '0' is sent, followed by a bitmap indicating the restriction for this row.

The previous step is then repeated for each of the $N_V$ "rows" of precoders.

This embodiment is illustrated with an example, considering the codebook subset restriction setting illustrated in FIG. 4, i.e. the restriction of precoders with indices (k,l)= (0,4), (3,5), (4,5), (7,4) should be signaled.

For l=0:
No precoders with l-index 0 should be restricted, therefore the bitmap '00000000' is sent.

For l=1:
The restriction of this row is identical to the restriction of the previous row, the bit '1' is sent.

For l=2:
The restriction of this row is identical to the restriction of the previous row, the bit '1' is sent.

For l=3:
The restriction of this row is identical to the restriction of the previous row, the bit '1' is sent.

For l=4:
The restriction of this row is not identical to the restriction of the previous row, therefore the bit '0' is sent. The bitmap indicating the restriction for this row should now be sent. Precoders (0,4) and (7,4) should be restricted. Therefore, the bitmap '10000001' is sent.

For l=5:
The restriction of this row is not identical to the restriction of the previous row, therefore the bit '0' is sent. The bitmap indicating the restriction for this row should now be sent. Precoders (3,5) and (4,5) should be restricted. Therefore, the bitmap '00011000' is sent.

For l=6:
The restriction of this row is not identical to the restriction of the previous row, therefore the bit '0' is sent. The bitmap indicating the restriction for this row should now be sent. No precoder should be restricted. Therefore, the bitmap '00000000' is sent.

For l=7:
The restriction of this row is identical to the restriction of the previous row, the bit '1' is sent.

The string of bits to be signaled is thus 000000000111010000001000011000000000001', consisting of 39 bits. Generally, the number of bits required with this scheme is $$N_{bits}=M \cdot N_H+N_V-1$$

Where M is the number of times the rows change and a bitmap for a row has to be transmitted, M=4 in the example. Analyzing the above expression, we note that $1 \leq M \leq N_V$. This means that for some of the $2^N=2^{N_H \cdot N_V}$ possible codebook subset restrictions, the number of bits required to signal the codebook subset restriction with this scheme is smaller than N, while for others, such as when $M=N_V$, the number of bits required is larger than N.

It should be noted that this is a small example for the sake of illustrating the embodiment. If a larger codebook is used, say $N_H=N_V=30$, and M=4 the number of bits required with this scheme would be $N_{bits}=M \cdot N_H+N_V-1=149$ compared to $N=N_H \cdot N_V=900$ in the case of just transmitting the entire bitmap; this is hence a substantial reduction in the number of required bits.

Finally, it is pointed out that all possible codebook subset restriction configurations can be represented by this encoding/decoding scheme, thereby providing full flexibility.

"Similar Columns" Embodiment

In another embodiment, the scheme discussed in the previous embodiment is modified by instead taking into consideration the hypothesis that precoders (k,l) with adjacent k-indices (i.e. $(k_0-1,l)$, $(k_0,l)$ and $(k_0+1,l)$) are likely to have the same restriction setting, meaning that if $(k_0,l)$ is restricted, $(k_0+1,l)$ is likely to be restricted as well and vice versa. The construction of the string of bits to be signaled would then work similarly as in the previously discussed embodiment, except that the precoders "columns" k will be used instead.

In another embodiment an extra initial bit is inserted where '1' indicates that encoding is done under the assumption that precoders (k,l) with adjacent l-indices (i.e. $(k,l_0-1)$, $(k,l_0)$ and $(k,l_0+1)$) are likely to have the same restriction, hence the encoding is done row wise, whereas a '0' indicates that precoders (k,l) with adjacent k-indices (i.e. $(k_0-1, l)$, $(k_0,l)$ and $(k_0+1,l)$) are likely to have the same restriction setting, hence encoding is done column wise.

In another embodiment an initial bit is inserted where '1' indicates that no precoders are restricted, a '0' indicates that some precoders are restricted and the '0' is followed by a number of bits representing the codebook subset restriction.

Accordingly, different "compression" techniques (whether based on similar rows, columns, or otherwise) may be adopted for different groups of precoders in the same codebook, where the particular technique is indicated to the device so that the device can decode the signaling. Alternatively, the same "compression" technique may be adopted for each of the groups of precoders, but the network evaluates different possible techniques to identify the one that provides the best compression and then adopts that approach (and indicates it to the device).

Of course, the embodiments shown in FIG. 2, and variations thereof, may be used for signaling a restricted subset of precoders in any given codebook, whether Kronecker structured or not. Moreover, the signaling may be rank-specific, meaning that different signaling restricts different rank-specific codebooks.

Figure 5:
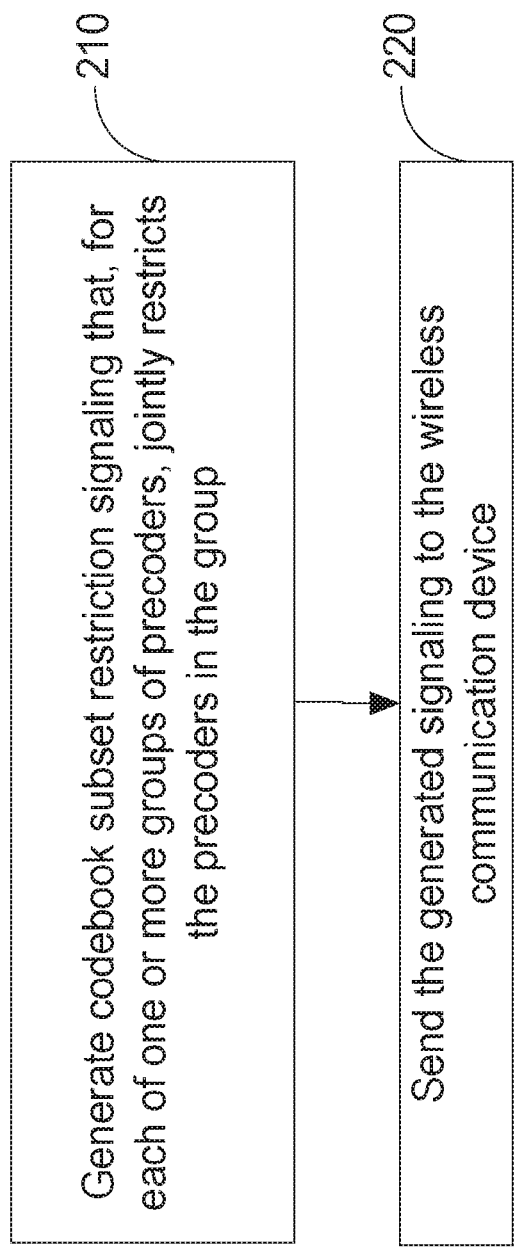
FIG. 5 is a logic flow diagram of a method implemented by a network node for signaling to a wireless communication device which precoders in a codebook are restricted from being used, according to other embodiments.

According to other embodiments shown in FIG. 5, a method is implemented in a network node 10 (e.g., a base station) for signaling to a wireless communication device 14 which precoders in a codebook are restricted from being used (e.g., which Kronecker product precoders are restricted). As shown, the method includes generating codebook subset restriction signaling that, for each of one or more groups of precoders, jointly restricts the precoders in the group, e.g., with a single signaling bit (Block 210). In at least some embodiments, this signaling (i) is rank-agnostic so as to restrict precoders irrespective of their transmission rank: and/or (ii) jointly restricts a group of precoders by restricting a certain component that those precoders (i.e., the precoders in the group) have in common. Regardless, the method then includes sending the generated signaling to the wireless communication device 14 (Block 220).

Consider embodiments that jointly restrict a group of precoders by restricting a certain component that those precoders (i.e., the precoders in the group) have in common. Precoders have a certain component in common if the precoders are derived from or are otherwise a function of that same component. In one embodiment, for example, a group of precoders W(b) that have a certain component b in common are jointly restricted by restricting that component b. Restriction of this component b may be signaled for instance in terms of one or more indices for the component (e.g., m where the component is indexed as $b_m$ or (k,l) where the component is indexed as $b_{k,l}$, with m, k, and l being indices for a Kronecker-structured codebook as described above).

Note that embodiments herein contemplate a precoder having one or more different "components" at any level of granularity (e.g., component(s) at a high level of precoder factorability and/or component(s) at a lower level of precoder factorability). For example, a precoder may comprise one or more different components b at one level of granularity. At a finer level of granularity, though, each of these components b may in turn be derived from or otherwise be a function of multiple sub-components $x_H$ and $x_V$ such that $b(x_H,x_V)$. In this case, a group of precoders $W(x_H,x_V)$ that have a certain component $x_H$ or $x_V$ in common may be jointly restricted by restricting that component $x_H$ or $x_V$. Restriction of this component $x_H$ or $x_V$ may be signaled for instance in terms of an index for the component (e.g., k or l where the component $x_H$ is indexed as $x_H^k$ and the component $x_V$ is indexed as $x_V^l$, with $x_H$ and $x_V$ being horizontal and vertical beamforming vectors, respectively, and with k and l being indices for a Kronecker-structured codebook as described above).

In some embodiments, a precoder at one level of granularity consists of one or more different components that are referred to as one or more so-called "beam precoders". Each precoder W in this regard consists of one or more beamforming vectors $b_0, b_1, \ldots, b_X$ that are referred to as beam precoders. One or more embodiments herein jointly restrict a group of precoders W that have a certain beam precoder in common, by restricting that beam precoder. With restriction of precoders W as a whole founded on restriction of one or more of their constituting beam precoders, these embodiments advantageously generate the CSR signaling in terms of beam-specific restrictions (i.e., restrictions of certain beam precoders), rather than in terms of precoder-specific restrictions (i.e., restrictions on precoders W as a whole). In some embodiments, the device 14 shall assume that a precoder W is restricted if one or more of its beam precoders are restricted. In other embodiments, each beam precoder must be restricted for the device 14 to assume that the total precoder W is restricted.

In one embodiment, a beam precoder is the beamforming vector used to transmit on a particular layer, where different scaled versions of that beamforming vector are transmitted on different polarizations. Different layers are transmitted on different beam precoders. A precoder W in this case can be expressed as:

$$W = \alpha \cdot \begin{bmatrix} b_0 & b_1 & \ldots & b_{L-1} \\ \varphi_0 b_0 & \varphi_1 b_1 & \ldots & \varphi_{L-1} b_{L-1} \end{bmatrix}$$

Here, W is a N×L precoder matrix, where N is the number of transmit antenna ports, L the transmission rank (i.e. the number of transmitted spatial streams), $b_0, b_1, \ldots, b_{L-1}$ are N/2×1 beamforming vectors (denoted beam precoders), $\varphi_0, \varphi_1, \ldots, \varphi_{L-1}$ and $\alpha$ are arbitrary complex numbers. Another precoder W of the same codebook as W above can be expressed as:

$$W = \alpha \cdot \begin{bmatrix} b_1 & b_2 & \ldots & b_L \\ \varphi_1 b_1 & \varphi_2 b_2 & \ldots & \varphi_L b_L \end{bmatrix}.$$

For example, by signaling $b_0$, only the former precoder is restricted and by signaling $b_1$ both precoders will be restricted.

In some embodiments, the first N/2 antenna ports are mapped to antennas with one polarization while the latter N/2 antenna ports are mapped to antennas with the same positions as the first antennas, but with an orthogonal polarization. In such embodiments, for each column of W (i.e. the precoder for each spatial layer), a beam precoder b is transmitted on one polarization and a scaled version of the same beam precoder φb is transmitted on a second polarization. Such scaling may impact the phase, amplitude, or both the phase and amplitude of the beam precoder.

In another embodiment, a beam precoder is the beamforming vector used to transmit on multiple different layers, where the layers are sent on orthogonal polarizations. In this case, a precoder W can be expressed as:

$$W = \alpha \cdot \begin{bmatrix} b_0 & b_0 & \ldots & b_0 \\ \varphi_0 b_0 & \varphi_1 b_0 & \ldots & \varphi_{L-1} b_0 \end{bmatrix}$$

Accordingly, it should be noted that the beam precoders for each spatial layer $b_0, b_1, \ldots, b_{L-1}$ may be different beam precoders, or, some subsets of the beam precoders may be identical, for example $b_0$ may be equal to $b_1$.

In yet another embodiment, a beam precoder is the beamforming vector used to transmit on a particular layer and on a particular polarization. That is, a beam precoder may be defined in a slightly different way than the definition above. The definition of a beam precoder may for example allow different beam precoders to be transmitted on the different polarizations of the same layer, such as $$W = \alpha \cdot \begin{bmatrix} b_0 & b_2 & \ldots & b_{2L-2} \\ \varphi_0 b_1 & \varphi_1 b_3 & \ldots & \varphi_{L-1} b_{2L-1} \end{bmatrix}.$$

In still another embodiment, the beam precoders may be defined by disregarding the polarization as $$W = \alpha \cdot [b_0 \ b_1 \ \ldots \ b_{L-1}].$$

Note that the beam precoders $b_0, b_1, \ldots, b_{L-1}$ may be chosen explicitly from a set of beam precoders (a codebook) or they may be implicitly chosen when selecting the (total) precoder W from a codebook X. It should be noted that the selection of the (total) precoder W may be made with one or several PMIs. In the case where selection of the total precoder W is made with several PMIs, the resulting beam precoders for each layer may be a function of only a subset of the PMIs or they may be a function of all PMIs.

Irrespective of the particular way a beam precoder is defined, though, one or more embodiments herein jointly restrict a group of precoders W that have a certain beam precoder in common, by restricting that beam precoder. That is, in some embodiments, codebook subset restriction (CSR) may be signaled based on the set of possible beam precoders b, instead of CSR signaled on the set of possible (total) precoders W. In some such embodiments, the device 14 shall assume that a precoder W is restricted if one or more of the beam precoders $b_0, b_1, \ldots, b_{L-1}$ of each layer are restricted. In other such embodiments, each layers' beam precoder must be restricted for the device 14 to assume that the total precoder W is restricted.

Consider a specific example for an 8TX codebook with transmission rank 2. In some embodiments, this codebook is defined as shown in FIG. 6. Defined in this way, each precoder W is formed in part from a beam precoder $v_m$ (note the notation shift from $b_0, b_1, \ldots, b_{L-1}$ to $v_m$). The beam precoder index m is the same for some precoders W, including for instance precoders whose subcodebook index is equal to 0, 1, 8, 9, 12 or 13 (since for those precoders $m=2i_1$). This means that those precoders W have the same beam precoder $v_m$ in common. Accordingly, some embodiments herein jointly restrict a group of precoders W that have a particular beam precoder $v_m$ in common, by restricting that beam precoder $v_m$, e.g., with a single bit. Restriction of this beam precoder $v_m$ may be signaled for instance in terms of index m (e.g., beam precoders indexed with a particular value of m are restricted). Signaling in this case may constitute a bitmap, with different bits in the bitmap respectively dedicated to indicating whether or not different beam precoders are restricted from being used. For example, signaling may constitute a bitmap of m values, with different bits in the bitmap respectively dedicated to indicating whether or not beam precoders indexed with different of m values are restricted from use.

In alternative embodiments not shown in FIG. 6, the beam precoder $v_m$ is replaced by beam precoder $v_{k,l}$, which is a Kronecker product of a vertical beamforming vector $x_V$ with index k and a horizontal beamforming vector $x_H$ with index l. For example, as noted above, these beamforming vectors may comprise DFT vectors. Regardless, restriction of beam precoder $v_{k,l}$ may be signaled in terms of the index pair (k,l). Signaling in this case may constitute a bitmap of (k,l) value pairs, with different bits in the bitmap respectively dedicated to indicating whether or not beam precoders indexed with different (k,l) value pairs are restricted from use.

Instead of such a bitmap, restriction of one or more beam precoders $v_{k,l}$ in some embodiments is jointly signaled in terms of a "rectangle" defined by two (k,l) value pairs: namely, $(k_0, l_0)$ and $(k_1, l_1)$. In this case, beam precoders $v_{k,l}$ with indices $k_0 < k < k_1$ and $l_0 < l < l_1$ are restricted.

As yet another alternative, restriction of one or more beam precoders $v_{k,l}$ in some embodiments is signaled in terms of a bitmap of k values and/or a bitmap of l values. If signaled as only a bitmap of k values, the device in some embodiments assumes that any beam precoders $v_{k,l}$ with certain k values are restricted, irrespective of those precoders' l values. If signaled as only a bitmap of l values, the device in some embodiments assumes that any beam precoders $v_{k,l}$ with certain l values are restricted, irrespective of those precoders' k values. If signaled as both a bitmap of k values and a bitmap of l values, the device in some embodiments assumes that only beam precoders $v_{k,l}$ with certain (k,l) value pairs as collectively defined by those bitmaps are restricted.

That said, restrictions specified in term of k and/or l values may in some sense be deemed as restrictions at a finer level of granularity than even the beam precoders themselves. Indeed, as noted above, each beam precoder $v_{k,l}$, is in some embodiments a Kronecker product of a vertical beamforming vector $x_V$ with index k and a horizontal beamforming vector $x_H$ with index l. Accordingly, signaling the restriction as k and/or l values effectively amounts to restricting (sub)components $x_H$ or $x_V$.

Consider an example of these finer-granularity embodiments where codebook subset restriction is to be applied to beam precoders with l values of 3 or 4. If this configuration of codebook subset restriction would be signaled with a conventional bitmap, $N = N_H \cdot N_V = 64$ bits would be used. By contrast, the scheme in these finer-granularity embodiments consider restriction of entire precoder "rows", i.e all precoders that are formed from beam precoders with the same l-index is either turned on or off. To signal the codebook subset restriction in this example, therefore, the bitmap '00011000' of l values, consisting of $N_V = 8$ bits, may be sent. With this scheme, a large reduction of the number of bits required to signal the codebook subset restriction is seen. However, not all of the $2^N$ possible codebook subset restrictions may be signaled.

In a similar embodiment, the restriction is applied on the precoder "columns" k and the codebook subset restriction is signaled with a $N_H$ bit long bitmap, indicating restrictions of entire precoder "columns".

In another embodiment an extra initial bit is inserted where '1' indicates that encoding is done as above "row wise", whereas a '0' indicates is done "column wise".

In yet another embodiment, the device 14 shall assume that a precoder W is restricted if both the vertical and the horizontal precoder in the Kronecker structure are restricted. If only one of the vertical and horizontal precoders are restricted, then the device 14 shall not assume that the resulting precoder after Kronecker operation is restricted.

Thus, one or more embodiments herein advantageously exploit a codebook's Kronecker structure to generate the signaling of FIG. 5 in terms of indices k, l, and/or m. In some embodiments, for example, the signaling is generated to jointly restrict, e.g., with a single bit, a group of precoders that either (i) have the same value of index k; (ii) have the same value of index l; or (iii) have the same pair of values for indices (k,l).

In some embodiments, signaling that jointly restricts a group of precoders by restricting a certain component (e.g., beam precoder) that those precoders have in common is rank-agnostic. That is, the signaling jointly restricts the group of precoders regardless of the precoders' transmission rank (i.e., regardless of which rank-specific codebook they belong to). For example, embodiments that restrict a single beam precoder $b_0$ can be extended so that all precoders across all ranks that contain the restricted beam precoder $b_0$ are restricted. Hence, all precoders across all ranks that contain a certain beam precoder $b_0$ is a precoder group that can be restricted jointly. According to some embodiments, therefore, an advantage of signaling CSR based on beam precoders is that one does not need to signal a separate CSR for precoders with different rank (precoders with different rank are restricted with the same CSR). This reduces signaling overhead.

Signaling that jointly restricts a group of precoders by restricting a certain component that those precoders have in common also proves effective for restricting precoders that transmit in whole or in part towards certain angular pointing directions. Indeed, according to some embodiments herein, the network node 10 jointly restricts a group of precoders that transmit at least in part towards a certain angular pointing direction, by restricting a certain component (e.g., beam precoder) which has that angular pointing direction. In this way, the network node 10 avoids transmitting energy in a certain direction, by signaling to the device 14 by means of CSR that the device 14 shall not compute feedback for that particular direction.

More specifically in this regard, when each precoder W is formed from multiple beam precoders, the precoder W in some sense has multiple angular pointing directions corresponding to the angular pointing directions of its constituent beam precoders (where each beam precoder has its own azimuth and zenith angular pointing direction for example). In another sense, though, the precoder W has an overall angular pointing direction that is a combination (e.g., average) of its beam precoders' respective directions. By restricting beam precoders that have certain angular pointing directions, embodiments herein effectively restrict precoders that transmit at least in part in those directions, and do so with reduced signaling overhead.

As an example, a set of rank-1 precoders with the same angular pointing direction but with different polarization properties, such as the whole set of rank-1 precoders $$\begin{bmatrix} b_0 \\ e^{j\omega_0}b_0 \end{bmatrix}, \begin{bmatrix} b_0 \\ e^{j\omega_1}b_0 \end{bmatrix}, \begin{bmatrix} b_0 \\ e^{j\omega_2}b_0 \end{bmatrix},$$

may be restricted by restriction signaling of a single beam precoder $b_0$. That is, when a restriction is signaled for a certain beam precoder, the restriction applies implicitly to all polarization phases of the signaled beam. Hence, the group of rank-1 precoders exemplified above is associated with a single CSR bit and is thus jointly restricted. This reduces device complexity and CSR signaling overhead, since only the beam direction needs to be signaled.

In another example, the set of rank-1 precoders $$\begin{bmatrix} b_0 \\ e^{j\omega_0}b_1 \end{bmatrix}, \begin{bmatrix} b_2 \\ e^{j\omega_1}b_0 \end{bmatrix}, \begin{bmatrix} b_0 \\ e^{j\omega_2}b_2 \end{bmatrix},$$

may be jointly restricted by restriction signaling of a single beam precoder $b_0$. Hence, the group of rank-1 precoders exemplified above is associated with a single CSR bit and is thus jointly restricted.

Restriction of precoders with certain angular pointing directions can also be accomplished by specifying restrictions in terms of certain k and/or l values. This is illustrated with reference to FIG. 7, which illustrates the angular beam pointing directions of rank-1 precoders in a codebook according to one example. In this example, the network node has a 4×4 antenna array where no mechanical downtilt is used. The Kronecker codebook consists of 8 vertical and 8 horizontal precoders, i.e. $N_H=N_V=8$. In this example, codebook subset restriction is applied to restrict beams with pointing directions in the zenith interval [80°,100°] (the interval is illustrated with dotted lines). That is, codebook subset restriction is applied in the angular interval 80°<θ<100°, such that the precoders with indices l-index 3 and 4 are restricted. The restricted beams are illustrated with an 'o' while the unrestricted beams are illustrated with an 'x'. The beam index k in the horizontal codebook and l in the vertical codebook is written next to the beams as (k,l). To signal the codebook subset restriction in this example, therefore, the bitmap '00011000' of l values, consisting of $N_V=8$ bits, may be sent. With this scheme, a large reduction of the number of bits required to signal the codebook subset restriction is seen.

In another embodiment, the device 14 shall assume that a precoder is restricted if both the vertical and horizontal precoder in the Kronecker structure are restricted. This allows to restrict a rectangular "window" of beam former pointing angles as seen from the network node 10.

This can also be accomplished by signaling the restriction as a "rectangle" of precoders defined by the index pairs $(k_0,l_0)$ and $(k_1,l_1)$. With this scheme, precoders with indices $k_0<k<k_1$ and $l_0<l<l_1$ are restricted.

Component-based restriction of a precoder group is just one example of embodiments that provide for rank-agnostic CSR signaling. Other embodiments herein also provide for such rank-agnostic signaling. For example, some embodiments herein generate signaling to jointly indicate that a group of precoders which transmit in whole or in part in certain angular pointing direction(s) are restricted, by generating the signaling to (explicitly or implicitly) indicate those angular pointing direction(s). The signaling may for instance specify an angular area or interval that is restricted, in terms of one or more angular parameters. This restriction may concern the angular pointing direction of a precoder as a whole, or the angular pointing direction of any beam precoder forming the precoder.

In one embodiment, the angular area or interval may be represented by angular points $(\phi_0,\theta_0)$ and $(\phi_1,\theta_1)$, spanning a rectangle in the angular domain. Here, $\phi$ and $\theta$ are the azimuth and zenith angles with respect to the eNodeB respectively. Multiple such rectangular areas may be signaled although the present embodiment focuses on the case of a single rectangular area for simplicity. The device 14 may then calculate the angular pointing directions of the precoders in the codebook and compare them to the restricted angular area to derive the codebook subset restriction. The device 14 may need some additional information regarding what to assume about the transmitter antenna array (which does not need to correspond to the actually used antenna array) to be able to calculate the pointing directions of the precoders. Consider an exemplary embodiment where the (sub)-codebooks of the Kronecker codebook consist of DFT-precoders, i.e The horizontal codebook can be expressed as $$X_H^k = \begin{bmatrix} 1 & e^{j2\pi \frac{1k+\Delta_h}{M_h Q_h}} & \ldots & e^{j2\pi \frac{(M_h-1)k+\Delta_h}{M_h Q_h}} \end{bmatrix}^T, k = 0, \ldots, M_h Q_h - 1,$$

where $Q_h$ is an integer horizontal oversampling factor and $\Delta_h$ can take on value in the interval 0 to 1 so as to "shift" the beam pattern ($\Delta_h=0.5$ could be an interesting value for creating symmetry of beams with respect to the broadside of an array).

The vertical codebook can be expressed as $$X_V^l = \begin{bmatrix} 1 & e^{j2\pi \frac{1l+\Delta_v}{M_v Q_v}} & \ldots & e^{j2\pi \frac{(M_v-1)l+\Delta_v}{M_v Q_v}} \end{bmatrix}^T, l = 0, \ldots, M_v Q_v - 1,$$

where $Q_v$ is an integer vertical oversampling factor and $\Delta_v$ is similarly defined as above.

The pointing direction of precoder (k,l) can be calculated by first calculating the pointing angle with respect to the broadside of the antenna array:

$$\tilde{\theta} = a\cos\left(\frac{k + \Delta - \frac{Q_v M_v}{2}}{d_V Q_v M_v}\right)$$

$$\tilde{\phi} = a\sin\left(\frac{l + \Delta - \frac{Q_h M_h}{2}}{d_H Q_h M_h \sin(\tilde{\theta})}\right)$$

Where $d_V$ and $d_H$ is the vertical and horizontal antenna element spacing of the array, in wavelengths, respectively. The mechanical downtilt angle $\beta$ is taken into account in order to calculate the actual beam pointing angles as:

$$\phi = \angle(\cos(\tilde{\phi})\sin(\tilde{\theta})\cos(-\beta) - \cos(\tilde{\theta})\sin(-\beta) + j\sin(\tilde{\phi})\sin(\tilde{\theta}))$$

$$\theta = a\cos(\cos(\tilde{\phi})\sin(\tilde{\theta})\sin(-\beta) + \cos(-\beta)\cos(\tilde{\theta}))$$

The device 14 needs to be signaled the additional information $d_H$, $d_V$ and $\beta$ to be able to calculate the beam pointing direction of the precoders in the codebook. It is assumed that the device 14 already knows the parameters $Q_v$, $M_v$, $Q_h$, $M_h$ and $\Delta$ as part of the codebook structure.

The set of parameters $\phi_0$, $\theta_0$, $\phi_1$, $\theta_1$, $d_H$, $d_V$, $\beta$ thus parameterizes the codebook subset restriction in this embodiment. When signaling said parameters, several strategies may be used.

In one embodiment, each parameter is uniformly quantized with a number of bits, over a predefined interval. An example is given in the table below.

| Parameters | Interval | Quantization bits |
|---|---|---|
| $\phi_0$, $\theta_0$, $\phi_1$, $\theta_1$ | [0, 180] [deg] | 6 |
| $d_H$, $d_V$ | [0, 2] | 4 |
| $\beta$ | [−30, 30] [deg] | 6 |

In this embodiment, the number of bits required to signal the codebook subset restriction is 38. Note that this is independent of the codebook size.

In another embodiment, each parameter may take a value from a fixed set of possible values. Each possible value of the parameter is encoded with a different number of bits depending on e.g. the perceived likelihood of the parameter taking that value. For example, the horizontal array element spacing $d_H$ may be encoded as follows

| Value | | | | | | |
|---|---|---|---|---|---|---|
| 0.5 | 0.8 | 0.65 | 1 | 4 | 2 | 0.75 |
| Bits | | | | | | |
| 1 | 01 | 0011 | 0010 | 0001 | 00001 | 00000 |

In this embodiment, the encoding of $d_H$ was designed to take into account $d_H=0.5$ is a common value for horizontal antenna element separation, thus encoding this value with a low number of bits. Other, less common, values are encoded with a larger number of bits. Note that the encoding of $d_H$ in this embodiment constitutes a uniquely decodable code.

In another embodiment, some of the parameters are uniformly quantized with a number of bits over a predefined interval, while other parameters are encoded with a different number of bits as in the previous embodiment.

In some other embodiments, different sets of parameters relating to the restricted angular area may constitute the parameters that define the codebook subset restriction. In one such embodiment, only a zenith interval $\theta_0 \leq \theta < \theta_1$ is restricted, and thus, $\theta_0$, $\theta_1$ may be sent. In another such embodiment, the restriction is only an azimuth interval $\phi_0 \leq \phi < \phi_1$. In yet another such embodiment, the angle interval may be open-ended, i.e. $\phi < \phi_1$ constitutes the restriction.

In other embodiments, parameters relating to the antenna array such as $d_H$, $d_V$ and $\Psi$ are not a part of the codebook subset restriction parameters, instead they may be already known to the UE or the UE assumes a default value of said parameters and the eNodeB chooses restriction angles ($\phi_0$, $\theta_0$) and ($\phi_1$, $\theta_1$) in such a way that the intended precoders are restricted when the UE calculates the restriction based on the default values of said parameters, where the default values of said parameters may differ from the actual value of said parameters.

In other embodiments, more parameters may be included in the codebook subset restriction parameters. In one such embodiment, the roll angle $\gamma$ of the antenna array may be included in the codebook subset restriction parameters.

In view of the above modifications and variations, one recognizes that there are many ways that the CSR signaling can jointly restrict precoders in a group. The signaling can be rank-agnostic or not. And the signaling can restrict a certain component that is common to the group or signal angular parameters associated with the group. The signaling can take the form of a bitmap for beam precoder indices, take the form of angular parameters, take the form of sub-codebook index pairs, take the form of a bitmap for indices of a single sub-codebook, etc. Irrespective of these particular variations, though, CSR signaling overhead is reduced based on correlation of the precoder restrictions or equivalently grouping of precoders. But the group-based joint restriction means that not all of the $2^N$ codebook subset restriction configurations are possible to convey to the device 14. Instead, only a subset of the possible configurations may be chosen.

Accordingly, at least some embodiments balance the loss in flexibility caused by joint restriction with the signaling overhead gains by such joint restriction by performing joint restriction with respect to only a portion of precoders in the codebook. That is, codebook subset restriction may be configured with full flexibility on a subset A of the precoders in the codebook (meaning that each of the precoders may be turned on or off individually), while only a few configurations may be chosen for the remaining set B of precoders. For example, the codebook subset restriction for the remaining set B of precoders may only be represented with one bit, turning all precoders in the set either on or off. This will reduce the CSR signaling overhead which is beneficial.

As an example in the context of beam precoders, the codebook may consist of two sets of precoders. One of the sets consist of precoders which may be equivalently expressed as a function of layer-specific beam precoders (as defined above) while the other set may consist of arbitrary precoders. In this embodiment, the first set of precoders may be configured with full flexibility while the other precoders in the codebook may be configured with limited flexibility.

Figure 8:
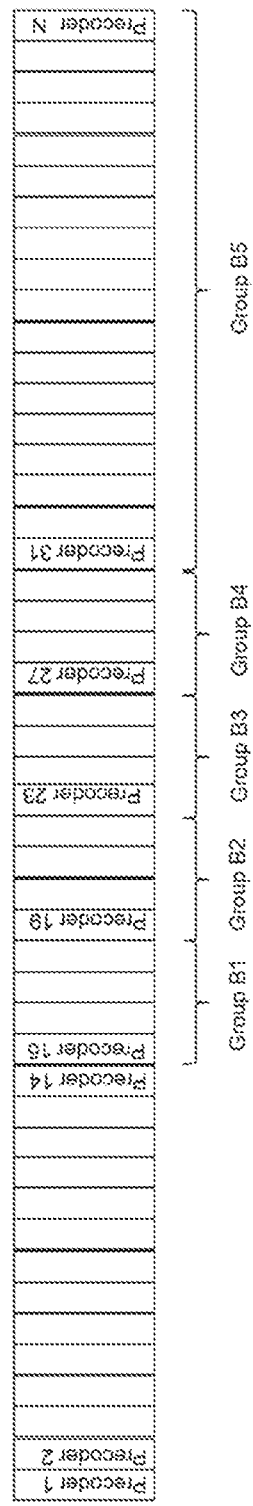
FIG. 8 is a block diagram of precoder groupings according to some embodiments.

This embodiment is just one example of grouping of the precoders in the codebook where precoders belonging to set A is individually represented by one bit while precoders in set B are all jointly restricted with a single bit. This embodiment can be further extended by having multiple sets B as B_1, B_2, . . . B_N where each of the set B_n, n=1, . . . , N contain at least two precoders each and is associated with one CSR bit. In FIG. 8 an example is shown where Precoder 1 to 14 are each represented by an individual bit (Set A), while all precoders in group B1 are represented by a single CSR bit, e.g. the bit for precoder 15.

The defined groups may also be overlapping, so that a given precoder exists in multiple groups. If this is the case, then priority or combining rules needs to be defined, so that the device 14 understands how to interpret the case when one precoder is restricted by the signaling of one group but not from another group it belong to.

In a further detailed embodiment, therefore, the groups B_n in FIG. 8 may be overlapping and rules are specified in standard text on how the device 14 shall interpret CSR signaling. For instance, assume two groups B_1 and B_2 each represented by one bit and that one precoder belongs to both groups. One rule may be that if a precoder is restricted in any of the groups it belongs, then the precoder should be assumed to be restricted. Another alternative is that the precoder must be restricted in both groups for the precoder to be assumed to be restricted.

In some embodiments in this disclosure, codebook subset restriction is discussed using the terminology precoders and codebooks. It may be assumed that beam specific restriction is used in said embodiments, and that the terminology may be interchanged to beam precoders and set of beam precoders, depending on the granularity being discussed.

Note that although terminology from 3GPP LTE has been used in this disclosure to exemplify embodiments herein, this should not be seen as limiting the scope of the embodiments to only the aforementioned system. Other wireless systems, including WCDMA, WiMax, UMB and GSM, may also benefit from exploiting the ideas covered within this disclosure.

Also note that terminology such as eNodeB and UE should be considering non-limiting and does in particular not imply a certain hierarchical relation between the two; in general "eNodeB" could be considered as device 1 and "UE" device 2, and these two devices communicate with each other over some radio channel. Herein, we also focus on wireless transmissions in the downlink, but embodiments herein are equally applicable in the uplink.

Embodiments herein also include methods in a wireless communication device 14 corresponding to the methods described above in a network node 10. These methods receive and decode the signaling that the network node 10 generates according to any of the embodiments above.

Figure 9:
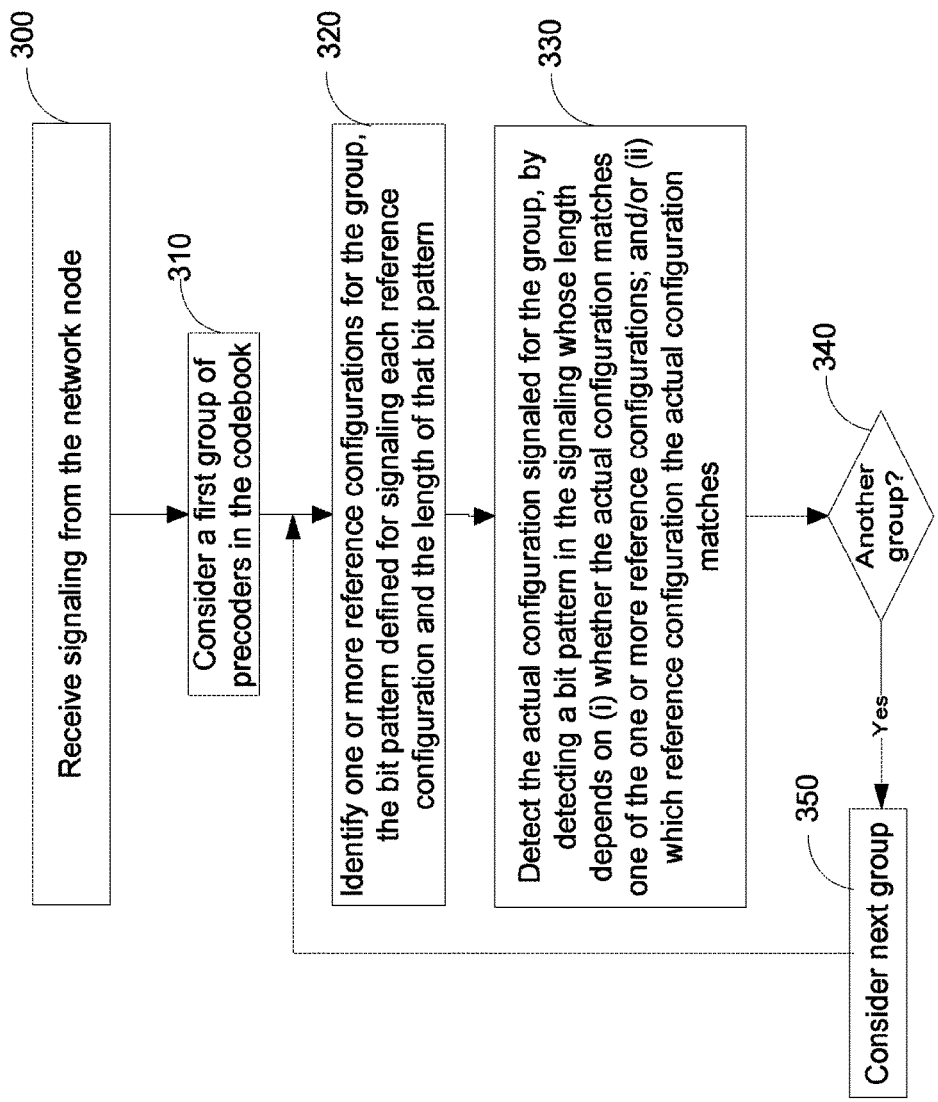
FIG. 9 is a logic flow diagram of a method implemented by a wireless communication device for decoding signaling from a network node indicating which precoders in a codebook are restricted from being used, according to some embodiments.

According to one embodiment shown in FIG. 9, for example, a method is implemented by a wireless communication device 14 (e.g., a UE) for decoding signaling from a network node 10 indicating which precoders in a codebook are restricted from being used. The method includes receiving the signaling (Block 300). The method also includes, for each of one or more groups of precoders in the codebook, decoding the signaling to identify which of different possible configurations is actually signaled for that group. Different possible configurations in this regard restrict different subgroups of precoders in the group from being used. This decoding proceeds on a group-by-group basis, starting with a first group (Block 310). Specifically, the decoding entails identifying one or more reference configurations for the first group, the bit pattern identified for signaling each reference configuration, and the length of that bit pattern (Block 320). These reference configuration(s) may be predefined at the device 14, or may be signaled from the network node 10. Regardless, decoding then entails detecting the actual configuration signaled for the group, by detecting a bit pattern in the received signaling whose length depends on (i) whether the actual configuration matches one of the one or more reference configurations; and/or (ii) which reference configuration the actual configuration matches (Block 330).

Such may entail, for example, determining the length B of the bit pattern defined for signaling a particular reference configuration, and checking whether a B-length string of the next bits in the signaling corresponds to the bit pattern defined for signaling that reference configuration. This determination and checking may be performed for each of the one or more reference configurations, after which (if no reference configurations are identified as being signaled) a default-length string of the next bits in the signaling is decoded for detecting non-reference configurations.

Regardless of the particular implementation of the decoding process (Blocks 320-330), the decoding is repeated for each of the one or more groups of precoders in the codebook (Blocks 340, 350).

Those skilled in the art will appreciate that the device-side embodiments include decoding of any of the network-side embodiments illustrated with reference to FIG. 3, including for instance the "similar rows embodiments" and the "similar columns embodiment."

Figure 10:
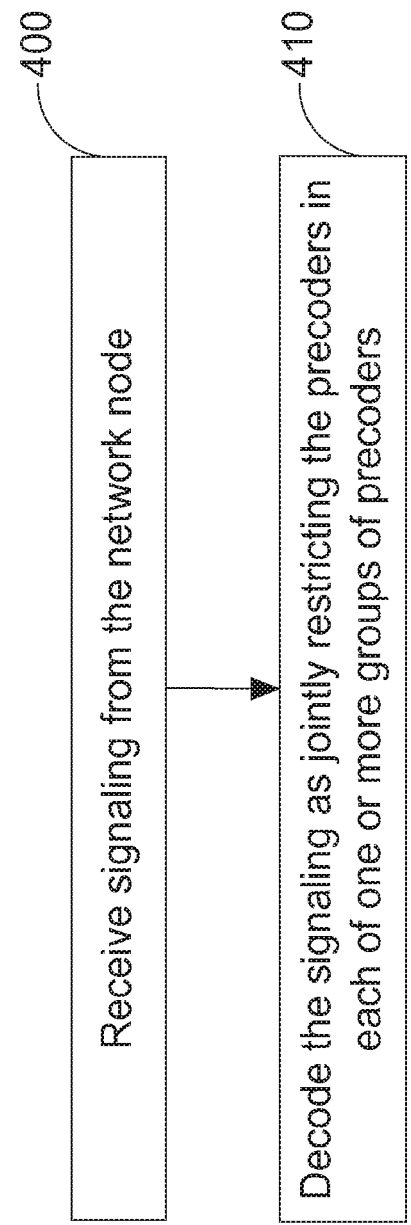
FIG. 10 is a logic flow diagram of a method implemented by a wireless communication device for decoding signaling from a network node indicating which precoders in a codebook are restricted from being used, according to other embodiments.

According to one or more other embodiments shown in FIG. 10, a method is implemented by a wireless communication device 14 (e.g., a UE) for decoding signaling from a network node 10 indicating which precoders in a codebook are restricted from being used (e.g., which Kronecker product precoders are restricted). As shown, the method includes receiving the signaling from a network node 10 (e.g., a base station) (Block 400). The method also includes decoding the signaling as jointly restricting precoders in each of one or more groups of precoders (Block 410). In at least some embodiments, such decoding involves decoding the signaling (i) as being rank-agnostic so as to restrict precoders irrespective of their transmission rank; and/or (ii) as jointly restricting a group of precoders by restricting a certain component that those precoders have in common.

Those skilled in the art will appreciate that the device-side embodiments include decoding of any of the network-side embodiments illustrated with reference to FIG. 5. So, for example, the device 14 in some embodiments decodes the signaling as jointly restricting a group of precoders that have a certain beam precoder in common, by restricting that beam precoder. And one or more device-side embodiments likewise advantageously exploit a codebook's Kronecker structure to decode the signaling of FIG. 10 in terms of indices k, l, and/or m. In some embodiments, for example, the signaling is decoding as jointly restricting, e.g., with a single bit, a group of precoders that either (i) have the same value of index k; (ii) have the same value of index l; or (iii) have the same pair of values for indices (k,l).

Figure 11:
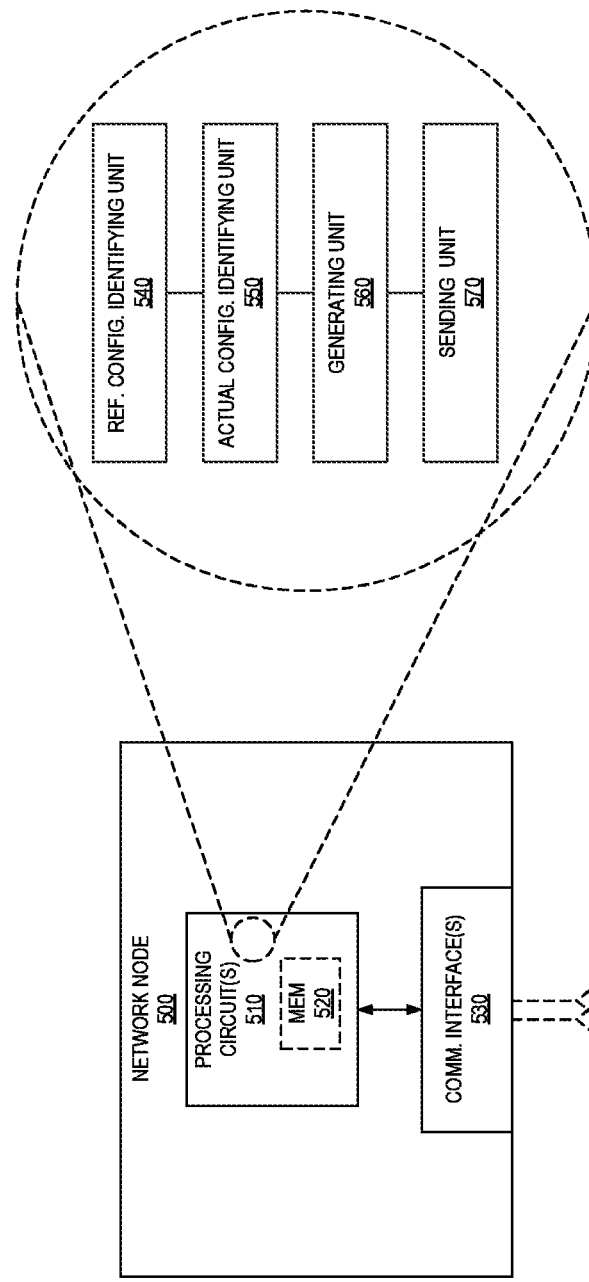
FIG. 11 is a block diagram of a network node according to some embodiments.

With the above modifications and variations in mind, FIG. 11 illustrates additional details of the network node 500 (corresponding to network node 10) according to one or more embodiments. The network node 500 is configured, e.g., via functional means or units 540-570, to implement the processing in FIG. 2 for signaling to a wireless communication device 14 which precoders in a codebook are restricted from being used. The network node 500 in some embodiments for example includes a reference configuration identifying means or unit 540 for identifying one or more reference configurations for each of one or more groups of precoders. The network node 500 in such case further includes an actual configuration identifying means or unit 550 for identifying an actual configuration for each of the one or more groups. The network node 500 also includes a signal generating means or unit 560 for generating signaling to indicate the actual configuration for each of the one or more groups, by generating the signaling as a bit pattern whose length depends on (i) whether the actual configuration matches one of the one or more reference configurations; and/or (ii) which reference configuration the actual configuration matches. The network node 500 finally includes a sending means or unit 570 for sending the generated signaling to the wireless communication device.

In at least some embodiments, the network node 500 comprises one or more processing circuits 510 configured to implement this processing, such as by implementing functional means or units 540-570. In one embodiment, for example, the node's processing circuit(s) 510 implement functional means or units 540-570 as respective circuits. The circuits in this regard may comprise circuits dedicated to performing certain functional processing and/or one or more microprocessors in conjunction with memory 520. In embodiments that employ memory 520, which may comprise one or several types of memory such as read-only memory (ROM), random-access memory, cache memory, flash memory devices, optical storage devices, etc., the memory stores program code that, when executed by the one or more for carrying out one or more microprocessors, carries out the techniques described herein.

In one or more embodiments, the network node 500 also comprises one or more communication interfaces 530. The one or more communication interfaces 530 include various components (not shown) for sending and receiving data and control signals. More particularly, the interface(s) 530 include a transmitter that is configured to use known signal processing techniques, typically according to one or more standards, and is configured to condition a signal for transmission (e.g., over the air via one or more antennas). Similarly, the interface(s) 530 include a receiver that is configured to convert signals received (e.g., via the antenna(s)) into digital samples for processing by the one or more processing circuits 510.

Figure 12:
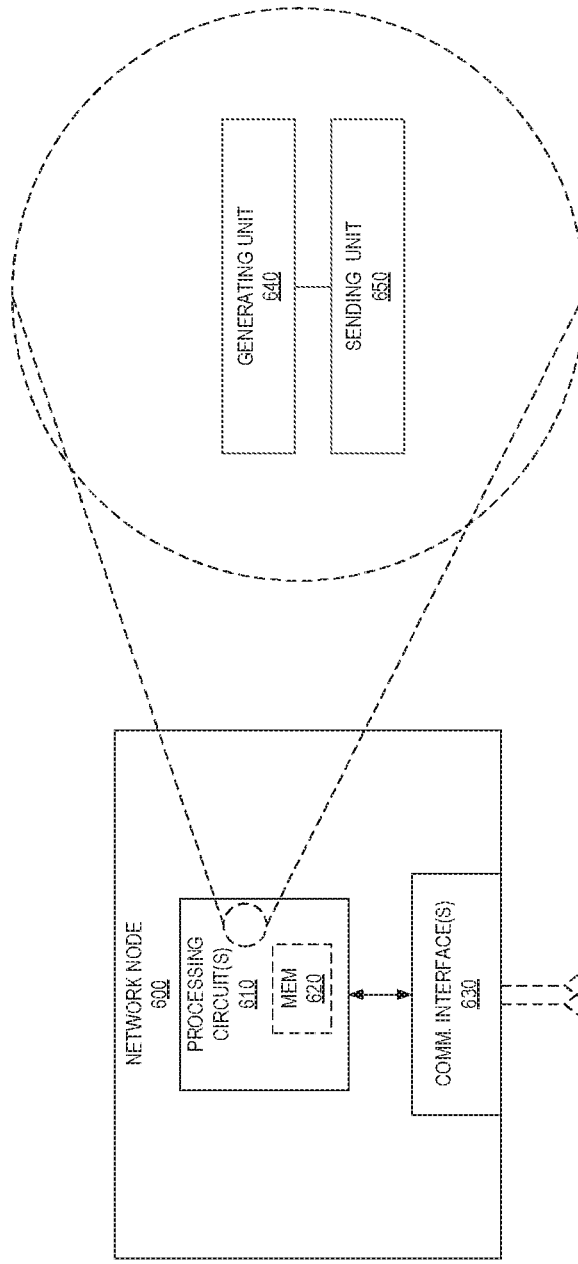
FIG. 12 is a block diagram of a network node according to other embodiments.

FIG. 12 illustrates additional details of the network node 600 according to one or more embodiments. The network node 600 is configured, e.g., via functional means or units 640-650, to implement the processing in FIG. 5 for signaling to a wireless communication device which precoders in a codebook are restricted from being used. The network node 600 in some embodiments for example includes a generating means or unit 640 for generating codebook subset restriction signaling that, for each of one or more groups of precoders, jointly restricts the precoders in the group, e.g., with a single signaling bit. The network node 600 also includes a sending means or unit 650 for sending the generated signaling to the wireless communication device.

In at least some embodiments, the network node 600 comprises one or more processing circuits 610 configured to implement this processing, such as by implementing functional means or units 640-650. In one embodiment, for example, the node's processing circuit(s) 610 implement functional means or units 640-650 as respective circuits (similarly to that described above, e.g., in conjunction with memory 620). In one or more embodiments, the network node 600 also comprises one or more communication interfaces 630.

Figure 13:
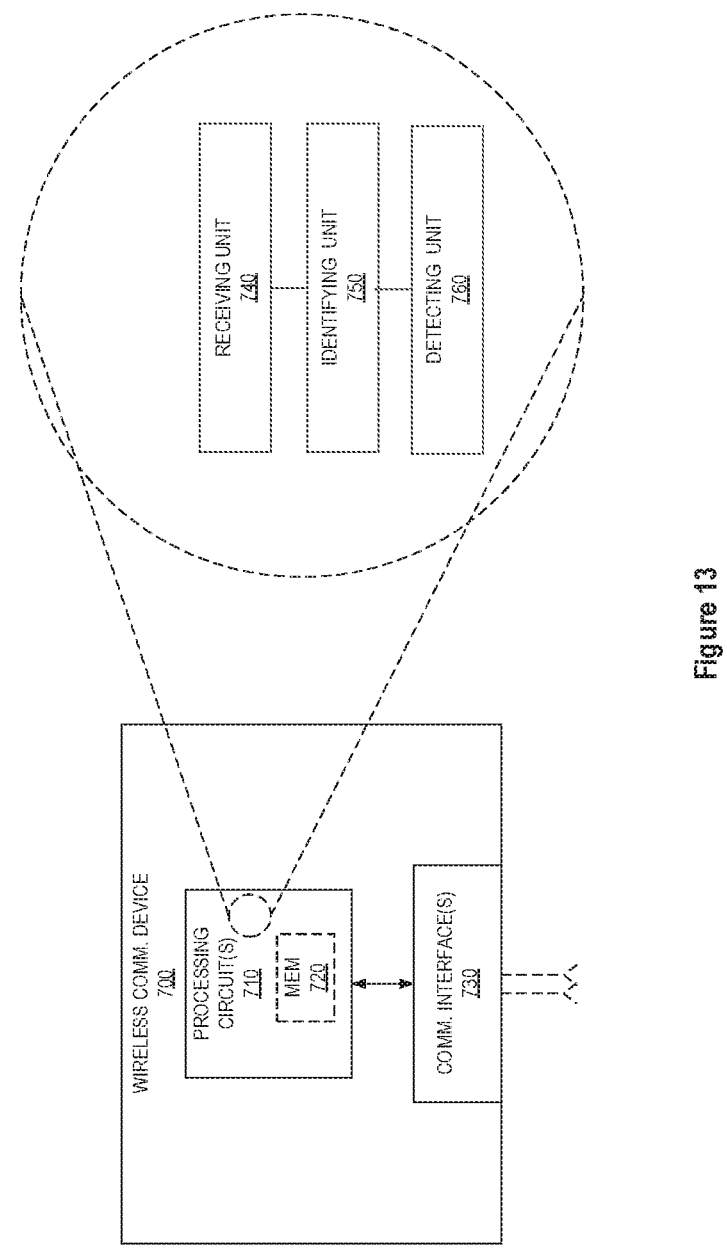
FIG. 13 is a block diagram of a wireless communication device according to some embodiments.

FIG. 13 illustrates additional details of the wireless communication device 700 (corresponding to wireless communication device 14) according to one or more embodiments. The device 700 is configured, e.g., via functional means or units 740-760, to implement the processing in FIG. 9 for decoding signaling from a network node indicating which precoders in a codebook are restricted from being used. The device 700 in some embodiments for example includes a receiving means or unit 740 for receiving the signaling from the network node. The device 700 further includes an identifying means or unit 750 configured, for each of one or more groups of precoders, to identify one or more reference configurations for the group, the bit pattern identified for signaling each reference configuration, and the length of that bit pattern. The device 700 finally includes a detecting means or unit 760 configured to detect the actual configuration signaled for the group, by detecting a bit pattern in the received signaling whose length depends on (i) whether the actual configuration matches one of the one or more reference configurations; and/or (ii) which reference configuration the actual configuration matches.

In at least some embodiments, the device 700 comprises one or more processing circuits 710 configured to implement this processing, such as by implementing functional means or units 740-760. In one embodiment, for example, the device's processing circuit(s) 710 implement functional means or units 740-760 as respective circuits. The circuits in this regard may comprise circuits dedicated to performing certain functional processing and/or one or more microprocessors in conjunction with memory 720. In embodiments that employ memory 720, which may comprise one or several types of memory such as read-only memory (ROM), random-access memory, cache memory, flash memory devices, optical storage devices, etc., the memory stores program code that, when executed by the one or more for carrying out one or more microprocessors, carries out the techniques described herein.

In one or more embodiments, the device 700 also comprises one or more communication interfaces 730. The one or more communication interfaces 730 include various components (not shown) for sending and receiving data and control signals. More particularly, the interface(s) 730 include a transmitter that is configured to use known signal processing techniques, typically according to one or more standards, and is configured to condition a signal for transmission (e.g., over the air via one or more antennas). Similarly, the interface(s) 730 include a receiver that is configured to convert signals received (e.g., via the antenna(s)) into digital samples for processing by the one or more processing circuits 710.

Figure 14:
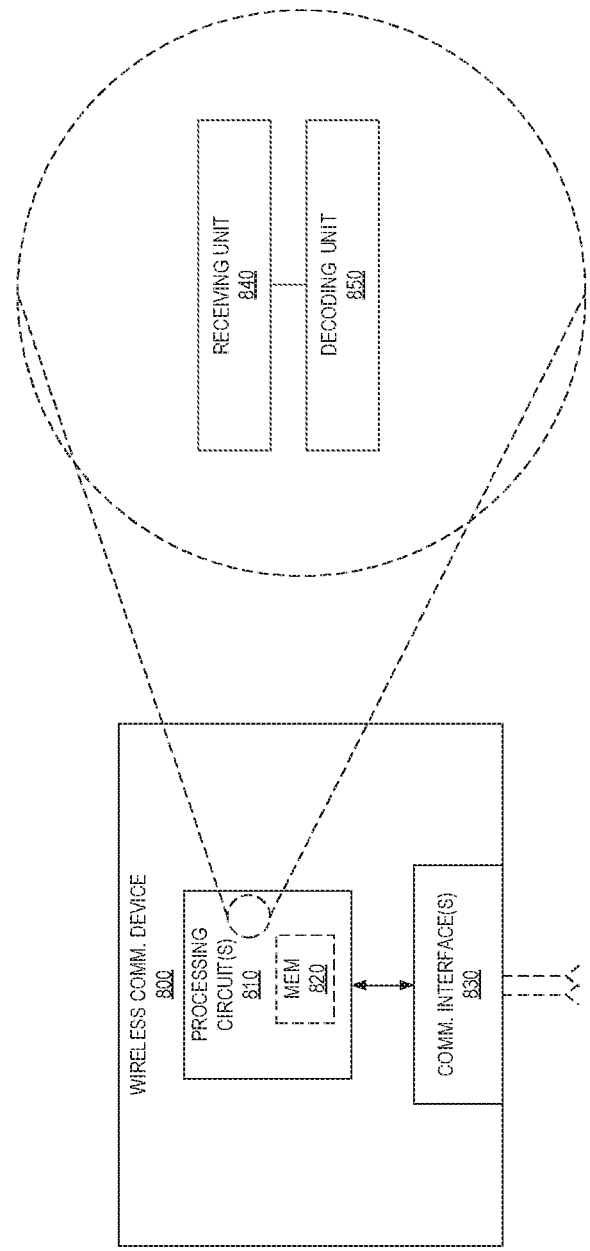
FIG. 14 is a block diagram of a wireless communication device according to other embodiments.

FIG. 14 illustrates additional details of the device 800 according to one or more other embodiments. The device 800 is configured, e.g., via functional means or units 840-850, to implement the processing in FIG. 10 for decoding signaling from a network node indicating which precoders in a codebook are restricted from being used. The device 800 in some embodiments for example includes a receiving means or unit 840 for receiving the signaling from the network node. The device 800 further includes a decoding means or unit 850 for decoding the signaling as jointly restricting precoders in each of one or more groups of precoders.

In at least some embodiments, the device 800 comprises one or more processing circuits 810 configured to implement this processing, such as by implementing functional means or units 840-850. In one embodiment, for example, the device's processing circuit(s) 810 implement functional means or units 840-850 as respective circuits (similarly to that described above, e.g., in conjunction with memory 820). In one or more embodiments, the device 800 also comprises one or more communication interfaces 830.

Those skilled in the art will also appreciate that embodiments herein further include corresponding computer programs.

A computer program comprises instructions which, when executed on at least one processor of the network node or the wireless communication device, cause node or device to carry out any of the respective processing described above. Embodiments further include a carrier containing such a computer program. This carrier may comprise one of an electronic signal, optical signal, radio signal, or computer readable storage medium.

A computer program in this regard may comprise one or more code modules corresponding to the means or units described above.

General Embodiments

In a first embodiment, a UE is able to receive messages in order to turn individual codewords on/off. The following holds for the set of possible messages:

At least one of these messages, which correspond to a certain configuration out of the 2^N possible configurations, is represented by less than N bits.

The message will contain information to define on/off for each individual codeword in the entire codebook.

Each message is uniquely decodable to the UE and will correspond to one of the 2^N possible configurations.

In a second embodiment, the UE of the first embodiment is configured such that codebook subset restriction is done on beam precoders.

In a third embodiment, the UE of the first embodiment is configured such that codebook subset restriction is configured with full flexibility for a subset of precoders in the codebook, while codebook subset restriction is configured with a limited flexibility for other precoders in the codebook.

In a fourth embodiment, the UE of the third embodiment is configured such that the set of precoders for which codebook subset restriction is configured with full flexibility is the set of precoders that may be equivalently expressed as a function of layer-specific beam precoders.

In a fifth embodiment, the UE of the first embodiment is configured such that N=N_H·N_V from the Kronecker structure.

In a sixth embodiment, the UE of any of the first through the fifth embodiments is configured such that the information used to design the set of messages consists of information about angular intervals which are likely to be restricted.

In a seventh embodiment, the UE of the first embodiment s configured such that only a subset of the 2^N possible configurations may be configured.

In an eighth embodiment, the UE of the first embodiment is configured such that at least one of the messages, which corresponds to a certain configuration out of the 2^N possible configurations, is represented more than N bits.

In a ninth embodiment, the UE of the first embodiment is configured such that the set of messages are designed using information about the likelihood of certain configurations being chosen.

In a tenth embodiment, the UE of the first embodiment is configured such that the information about the likelihood of certain configurations being chosen is only an implicit assumption of the likelihoods.

In an eleventh embodiment, the UE of the first embodiment is configured such that a set of angles specifies the configuration.

What is claimed is:

1. A method implemented by a network node for signaling to a wireless communication device which precoders in a codebook are restricted from being used, the method characterized by:
generating codebook subset restriction signaling that, for each of one or more groups of precoders, jointly restricts the precoders in the group by restricting a certain component that the precoders in the group have in common, wherein the codebook subset restriction signaling is rank-agnostic signaling that jointly restricts the precoders in a group without regard to the precoders' transmission rank; and
sending the generated signaling from the network node to the wireless communication device.

2. The method of claim 1, wherein a precoder comprising one or more beam precoders is restricted if at least one of its one or more beam precoders is restricted.

3. The method of claim 1, wherein the certain component comprises a beam precoder.

4. The method of claim 3, wherein a beam precoder is a Kronecker product of different beamforming vectors associated with different dimensions of a multi-dimensional antenna array.

5. The method of claim 4, wherein the different beamforming vectors comprise Discrete Fourier Transform (DFT) vectors.

6. The method of claim 3, wherein the beam precoder is a beamforming vector used to transmit on a particular layer of a multi-layer transmission; and wherein different scaled versions of that beamforming vector are transmitted on different polarizations.

7. The method of claim 3, wherein the beam precoder is a Kronecker product of first and second beamforming vectors with first and second indices, wherein the first and second beamforming vectors are associated with different dimensions of a multi-dimensional antenna array, and wherein the codebook subset restriction signaling jointly restricts the precoders in a group of precoders that have the same pair of values for the first and second indices.

8. A method implemented by a wireless communication device for decoding signaling from a network node indicating which precoders in a codebook are restricted from being used, the method characterized by:
receiving codebook subset restriction signaling that, for each of one or more groups of precoders, jointly restricts the precoders in the group by restricting a certain component that the precoders in the group have in common, wherein the codebook subset restriction signaling is rank-agnostic signaling that jointly restricts the precoders in a group without regard to the precoders' transmission rank; and
decoding the received signaling as jointly restricting precoders in each of the one or more groups of precoders.

9. The method of claim 8, wherein a precoder comprising one or more beam precoders is restricted if at least one of its one or more beam precoders is restricted.

10. The method of claim 8, wherein the certain component comprises a beam precoder.

11. The method of claim 10, wherein the beam precoder is a Kronecker product of different beamforming vectors associated with different dimensions of a multi-dimensional antenna array.

12. The method of claim 11, wherein the different beamforming vectors comprise Discrete Fourier Transform (DFT) vectors.

13. The method of claim 10, wherein the beam precoder is a beamforming vector used to transmit on a particular layer of a multi-layer transmission; and wherein different scaled versions of that beamforming vector are transmitted on different polarizations.

14. The method of claim 8, wherein a beam precoder is a Kronecker product of first and second beamforming vectors with first and second indices, wherein the first and second beamforming vectors are associated with different dimensions of a multi-dimensional antenna array, and wherein the codebook subset restriction signaling jointly restricts the precoders in a group of precoders that have the same pair of values for the first and second indices.

15. A network node for signaling to a wireless communication device which precoders in a codebook are restricted from being used, the network node comprising:
a processor and a memory, the memory containing instructions executable by the processor whereby the network node is configured to:
generate codebook subset restriction signaling that, for each of one or more groups of precoders, jointly restricts the precoders in the group by restricting a certain component that the precoders in the group have in common, wherein the codebook subset restriction signaling is rank-agnostic signaling that jointly restricts the precoders in a group without regard to the precoders' transmission rank; and
send the generated signaling from the network node to the wireless communication device.

16. The network node of claim 15, wherein a precoder comprising one or more beam precoders is restricted if at least one of its one or more beam precoders is restricted.

17. The network node of claim 15, wherein the certain component comprises a beam precoder.

18. The network node of claim 17, wherein the beam precoder is a Kronecker product of different beamforming vectors associated with different dimensions of a multi-dimensional antenna array.

19. The network node of claim 18, wherein the different beamforming vectors comprise Discrete Fourier Transform (DFT) vectors.

20. The network node of claim 17, wherein the beam precoder is a beamforming vector used to transmit on a particular layer of a multi-layer transmission; and wherein different scaled versions of that beamforming vector are transmitted on different polarizations.

21. The network node of claim 17, wherein the beam precoder is a Kronecker product of first and second beamforming vectors with first and second indices, wherein the first and second beamforming vectors are associated with different dimensions of a multi-dimensional antenna array, and wherein the codebook subset restriction signaling jointly restricts the precoders in a group of precoders that have the same pair of values for the first and second indices.

22. A wireless communication device for decoding signaling from a network node indicating which precoders in a codebook are restricted from being used, the wireless communication device comprising:
a processor and a memory, the memory containing instructions executable by the processor whereby the wireless communication device is configured to:
receive codebook subset restriction signaling that, for each of one or more groups of precoders, jointly restricts the precoders in the group by restricting a certain component that the precoders in the group have in common, wherein the codebook subset restriction signaling is rank-agnostic signaling that jointly restricts the precoders in a group without regard to the precoders' transmission rank; and
decode the received signaling as jointly restricting precoders in each of the one or more groups of precoders.

23. The wireless communication device of claim 22, wherein a precoder comprising one or more beam precoders is restricted if at least one of its one or more beam precoders is restricted.

24. The wireless communication device of claim 22, wherein the certain component comprises a beam precoder.

25. The wireless communication device of claim 24, wherein the beam precoder is a Kronecker product of different beamforming vectors associated with different dimensions of a multi-dimensional antenna array.

26. The wireless communication device of claim 25, wherein the different beamforming vectors comprise Discrete Fourier Transform (DFT) vectors.

27. The wireless communication device of claim 24, wherein the beam precoder is a beamforming vector used to transmit on a particular layer of a multi-layer transmission; and wherein different scaled versions of that beamforming vector are transmitted on different polarizations.

28. The wireless communication device of claim 24, wherein the beam precoder is a Kronecker product of first and second beamforming vectors with first and second indices, wherein the first and second beamforming vectors are associated with different dimensions of a multi-dimensional antenna array, and wherein the codebook subset restriction signaling jointly restricts the precoders in a group of precoders that have the same pair of values for the first and second indices.

* * * * *

UNITED STATES PATENT AND TRADEMARK OFFICE
CERTIFICATE OF CORRECTION

PATENT NO. : 10,193,600 B2
APPLICATION NO. : 15/105648
DATED : January 29, 2019
INVENTOR(S) : Faxer et al.

It is certified that error appears in the above-identified patent and that said Letters Patent is hereby corrected as shown below:

In the Specification

Column 4, Line 44, delete "comprise;" and insert -- comprise: --, therefor.

Column 10, Line 17, delete "two PMIS" and insert -- two PMIs --, therefor.

Column 13, Line 30, delete "rank:" and insert -- rank; --, therefor.

Column 15, Lines 51-52, delete "index is" and insert -- index $i_2$ is --, therefor.

Column 19, Line 53, delete "$\theta = a \cos(\tilde{\phi})\sin(\tilde{\theta})\sin(-\beta)+\cos(-\beta)\cos(\tilde{\theta}))$" and insert
-- $\theta = acos(cos(\tilde{\phi})\ sin(\tilde{\theta})\ sin(-\beta) + cos(-\beta)\ cos(\tilde{\theta}))$ --, therefor.

Column 26, Line 14, delete "s configured" and insert -- is configured --, therefor.

In the Claims

Column 26, Line 51, Claim 4, delete "a beam" and insert -- the beam --, therefor.

Column 27, Line 37, Claim 14, delete "claim 8, wherein a beam" and insert -- claim 10, wherein the beam --, therefor.

Signed and Sealed this
Twenty-fifth Day of June, 2019

Andrei Iancu
*Director of the United States Patent and Trademark Office*